United States Patent
Ogawa et al.

(10) Patent No.: US 6,781,286 B2
(45) Date of Patent: *Aug. 24, 2004

(54) PIEZOELECTRIC DRIVING DEVICE

(75) Inventors: Yuko Ogawa, Katano (JP); Hirokazu Uchiyama, Higashiosaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/285,409

(22) Filed: Nov. 1, 2002

(65) Prior Publication Data

US 2003/0168935 A1 Sep. 11, 2003

(30) Foreign Application Priority Data

Nov. 2, 2001 (JP) .................................... P2001-337515

(51) Int. Cl.$^7$ ................................................ H01L 41/08

(52) U.S. Cl. ...................................... 310/333; 310/328

(58) Field of Search ............................... 310/328, 321, 310/333; 360/296.4, 244.1, 294.2–6, 78.05; G11B 21/10; H01L 41/08

(56) References Cited

U.S. PATENT DOCUMENTS

| | | | | |
|---|---|---|---|---|
| 5,247,493 A | * | 9/1993 | Kime et al. | 360/294.7 |
| 5,760,947 A | * | 6/1998 | Kim et al. | 310/328 |
| 6,181,531 B1 | * | 1/2001 | Koshikawa et al. | 360/294.4 |
| 6,532,138 B1 | * | 3/2003 | Koganezawa | 360/294.4 |
| 6,538,854 B2 | * | 3/2003 | Koganezawa et al. | 310/333 |
| 6,618,220 B2 | * | 9/2003 | Inagaki et al. | 360/78.05 |
| 2001/0021086 A1 | | 9/2001 | Kuwajima et al. | |
| 2002/0048124 A1 | * | 4/2002 | Kuwajima et al. | 360/294.4 |

FOREIGN PATENT DOCUMENTS

| | | |
|---|---|---|
| EP | 1 126 530 | 8/2001 |
| JP | 02-278910 | 11/1990 |
| JP | 2001-216748 | 8/2001 |

* cited by examiner

*Primary Examiner*—Thomas M. Dougherty
*Assistant Examiner*—Karen Addison
(74) *Attorney, Agent, or Firm*—Wenderoth, Lind & Ponack L.L.P.

(57) ABSTRACT

A piezoelectric driving device of the present invention prevents a short circuit from occurring between electrode metallic films even if bonding-wire is performed. The piezoelectric driving device is a piezoelectric driving device in which a piezoelectric thin plate is joined to one side of a substrate, and a terminal electrode for applying a signal for expanding or contracting the piezoelectric thin plate is further formed on the plane. The terminal electrode is formed on one side of the substrate via a piezoelectric-member pedestal separated from the piezoelectric thin plate.

13 Claims, 24 Drawing Sheets

Applied voltage of terminal 9A

Applied voltage of terminal 9D

PIEZOELECTRIC DRIVING DEVICE

BACKGROUND OF THE INVENTION

1. Field of the Invention

The present invention relates to a piezoelectric driving device and its fabricating method, particularly to a piezoelectric driving device used for an actuator or the like for performing precise position control and its fabricating method.

2. Description of the Prior Art

In recent years, the recording density of a magnetic disk set at a magnetic disk drive has been continuously improved at an annual rate of 10%. A magnetic head used to record and reproduce data in and from a magnetic disk is normally mounted on a slider and the slider with the magnetic head mounted on it is supported by a head-supporting mechanism set in a magnetic disk drive.

To improve the recording density of a magnetic disk, it is necessary to very accurately position a magnetic head with respect to the magnetic disk. To realize the above mentioned requirement, a piezoelectric driving device using a piezoelectric-member element is set at a head-supporting mechanism. In the case of the piezoelectric-member element of the piezoelectric driving device, an electrode metallic film is formed on both principal planes of a thin-film piezoelectric member. When a voltage is applied between the two electrode metallic films, the thin-film piezoelectric member expands or contracts in the in-plane direction. Position control of a magnetic head is accurately performed by using the fluctuation due to the above telescopic motion (e.g. refer to Japanese Non-examined Publication No. 2001-216748).

In the case of the above thin-film piezoelectric-member element, a voltage is applied to an electrode metallic film through a bonding wire joined to the surface of the metallic film. The bonding wire is joined to a predetermined position on the electrode metallic film through ultrasonic joining.

However, during ultrasonic-joining of a bonding wire to an electrode metallic film, damage such as a crack occurs in an electrode metallic film and thin-film piezoelectric member, and moisture and steam enter the electrode metallic film and thin-film piezoelectric member. Thereby, the metal in the electrode metallic film ionizes, diffuses in a thin-film piezoelectric member between adjacent conductors (electrode metallic films) having a potential difference, and precipitates as a metal on the surface of the opposite conductor again. Thus, because the tree-like conductors are cross-linked by the metal, a problem occurs in that a short-circuit-mode failure (ion migration) occurs. As a result, the reliability of a piezoelectric element deteriorates. The above phenomenon is particularly remarkable under a high-humidity environment.

The present invention is made to solve the above problem, and its object is to provide a piezoelectric driving device in which a short circuit does not easily occur between electrode metallic films even if performing bonding-wire joining and its fabricating method.

SUMMARY OF THE INVENTION

To achieve the above object, a piezoelectric driving device of the present invention is a piezoelectric driving device in which a piezoelectric thin plate is joined to one side of a substrate and a terminal electrode for applying a signal for expanding or contracting the piezoelectric thin plate is further formed on the plane. The terminal electrode is formed on one side of the substrate through a piezoelectric-member pedestal separated from the piezoelectric thin plate.

In the case of the piezoelectric driving device of the present invention constituted as described above, because the piezoelectric thin plate serving as a piezoelectric displacement region is separated from the piezoelectric pedestal on which the terminal electrode is formed, it is possible to decrease a mechanical impact or vibrations under wire bonding to the piezoelectric displacement region and prevent a crack or the like from occurring in the piezoelectric thin plate.

Moreover, in the case of a piezoelectric driving device of the present invention, it is preferable that the above piezoelectric thin plate and piezoelectric-member pedestal have the same laminated structure when a plurality of layers are laminated respectively.

Furthermore, in the case of a piezoelectric driving device of the present invention, it is possible to use a substrate which can be expanded or contracted corresponding to expansion or contraction of the above piezoelectric thin plate as the above substrate, or to use a non-retractable substrate which can be deflected as the above piezoelectric thin plate.

In the case of a piezoelectric driving device of the present invention, it is possible to constitute the above non-retractable substrate by fixing a metal thin plate (e.g. stainless-steel thin plate) opposite to the above piezoelectric thin plate and connecting a wiring metal to the above terminal electrode by a resin.

In the case of a piezoelectric driving device of the present invention, it is possible that two piezoelectric-member-driving portions are included and the above piezoelectric thin plate is divided into two plates corresponding to each piezoelectric-member-driving portion.

In the case of a piezoelectric driving device including two piezoelectric-member-driving portions, it is possible to constitute the above terminal electrode by a signal terminal electrode connected to one of the two piezoelectric-driving portions, a signal terminal electrode connected to the other of them, and a ground terminal electrode common to the two piezoelectric-driving portions.

In the case of a piezoelectric driving device of the present invention, it is preferable that the above piezoelectric thin plate has a laminated structure in which a first thin-film piezoelectric-member layer and a second thin-film piezoelectric-member layer on each of whose faces an electrode film is respectively formed are joined by an adhesive, and electrode films facing each other through the adhesive are used as ground electrode films.

In the case of a piezoelectric driving device of the present invention, it is possible to use the above terminal electrode as a wire-bonding terminal.

Moreover, a piezoelectric-member-driving-device-fabricating method of the present invention comprises forming a first electrode, a first piezoelectric-member thin film, and a second electrode on a first substrate and forming a third electrode, a second piezoelectric-member thin film, and a fourth electrode on a second substrate. The above second electrode is arranged to face the above fourth electrode, and they are bonded by an adhesive, thereby pasting the above first substrate with the above second substrate. A piezoelectric-laminated body layer in which the above first electrode, first piezoelectric-member thin film, second electrode, fourth electrode, second piezoelectric-member thin film, and third electrode are laminated between the above first and second substrates is formed. The above second substrate is removed. A part of the above piezoelectric laminated-body layer on the above first substrate is separated to form at least two piezoelectric-member pedestals formed by the separated portion. A first bonding electrode connected to the above second and fourth electrodes is formed on one of the two piezoelectric-member pedestals, and a second bonding electrode connected to the above first and third electrodes is formed on the other of the two pedestals. A transferring substrate is joined onto the above piezoelectric-laminated-body layer and two piezoelectric-member pedestals, and then the above first substrate and transferring substrate are removed. A non-retractable substrate which can be deflected instead of the removed first substrate is joined.

According to a fabrication method of the piezoelectric driving device of the present invention constituted as described above, it is possible to fabricate a piezoelectric driving device in which a piezoelectric-member-laminated body layer functioning as a piezoelectric displacement region is separated from the above piezoelectric-member pedestal on which the above terminal electrode is formed.

DETAILED DESCRIPTION OF THE PREFERRED EMBODIMENTS

Embodiment 1

A head-supporting mechanism of the embodiment 1 of the present invention is described below.

Figure 1:
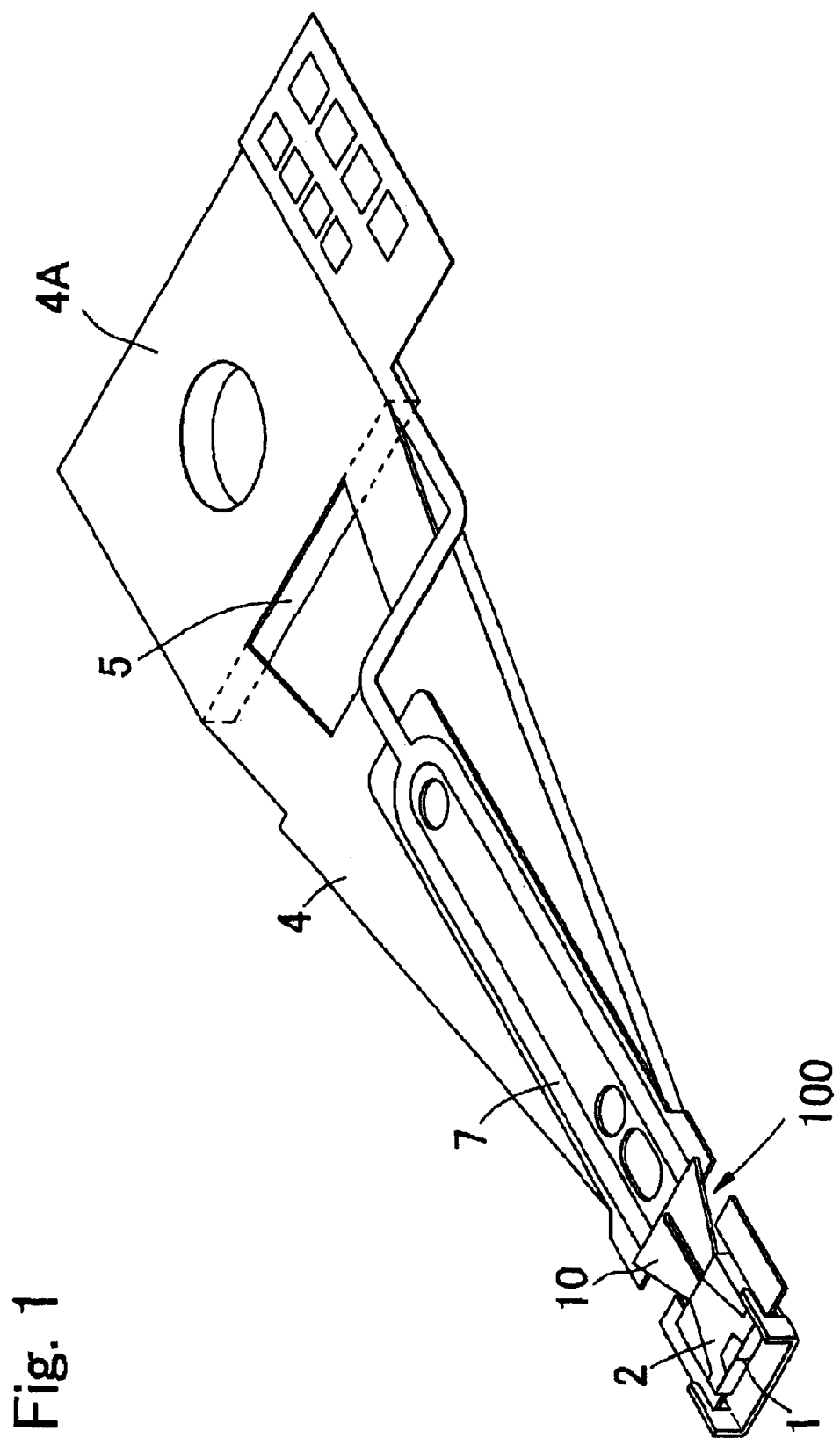
FIG. 1 is a perspective view showing a general configuration of a head-supporting mechanism of embodiment 1 of the present invention.

As shown in FIG. 1, the head-supporting-mechanism portion of the embodiment 1 is constituted by a load beam 4, a slider 2 provided at the front end of the load beam 4, and a flexure 7 to whose front end the slider 2 is connected. In the case of the head-supporting mechanism of the first embodiment, a piezoelectric-member-driving portion 100 is formed on a part of the flexure 7 by using a thin-film piezoelectric-member element 10, and the magnetic head 1 set to one end face of the slider 2 can be positioned by rotating the slider 2 by the piezoelectric-member-driving portion 100.

The load beam 4 is fixed to a base plate 5 at the proximal end of the beam 4 through beam welding.

In the case of the head-supporting mechanism portion of this first embodiment, the thin-film piezoelectric-member element 10 is constituted by two thin-film piezoelectric-member elements 10A and 10B formed by dividing a trapezoidal piezoelectric-laminated body into two parts at its central portion. Moreover, the thin-film piezoelectric-member element 10 has a signal terminal portion 40 on each of the thin-film piezoelectric-member elements 10A and 10A and 10B, respectively, and a ground terminal portion 30 set as a common terminal of the thin-film piezoelectric-member elements 10A and 10B so that the two thin-film piezoelectric-member elements 10A and 10B can be separately controlled corresponding to an applied voltage.

Figure 3:
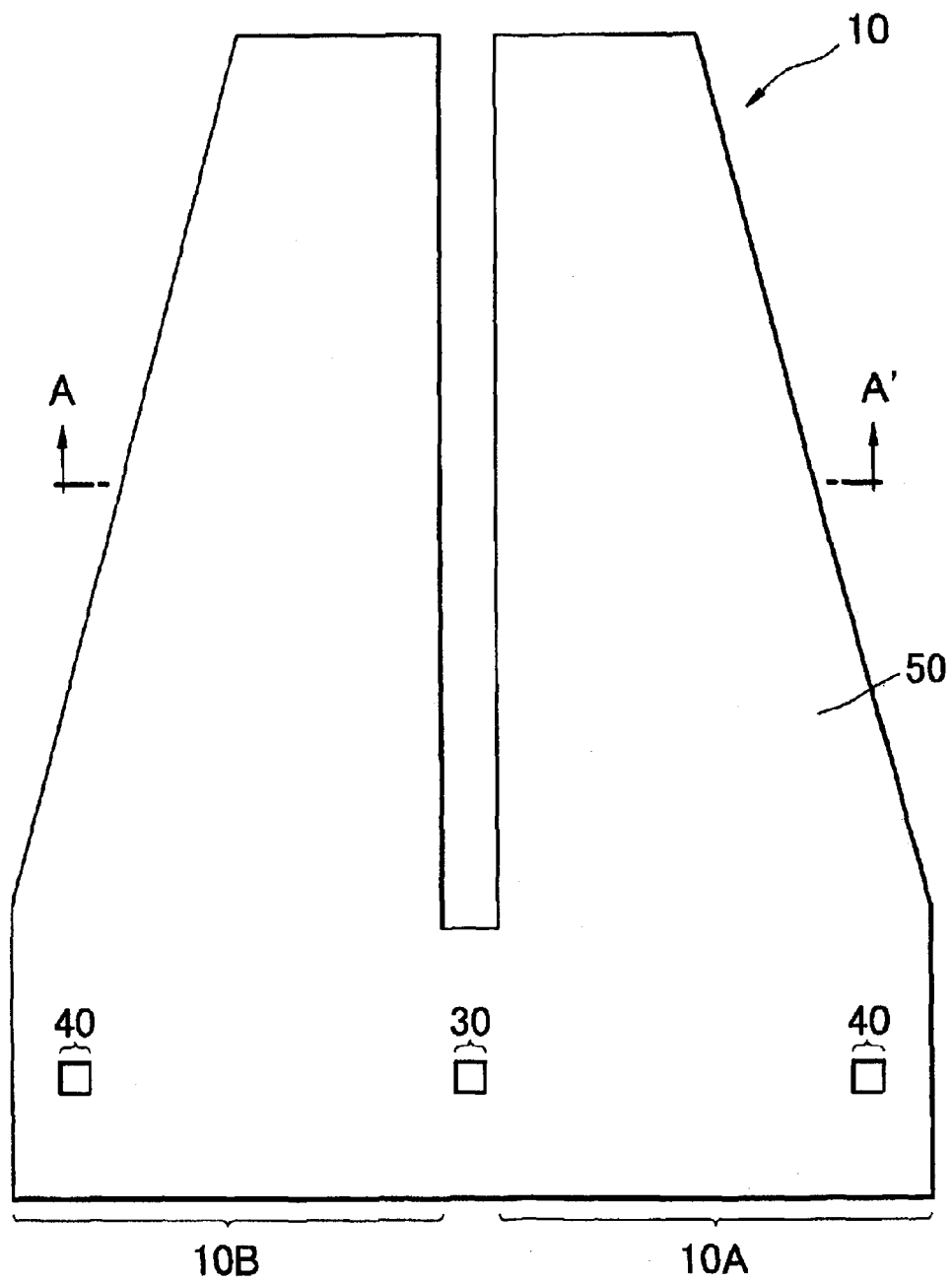
FIG. 3 is a top view of a thin-film piezoelectric-member element used for the head-supporting mechanism of the embodiment 1.
Figure 4:
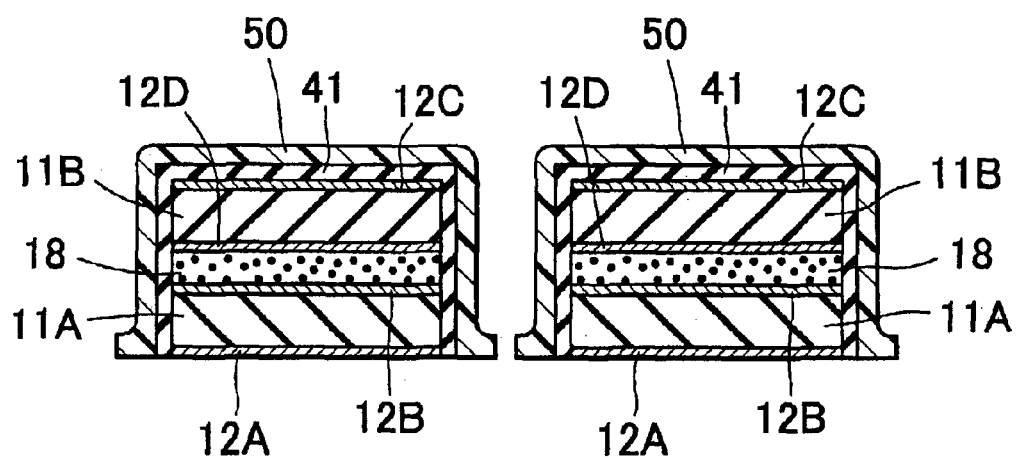
FIG. 4 is a sectional view of the thin-film piezoelectric-member element in FIG. 3 taken along the line A–A' of FIG. 3.

As shown in FIG. 4 (sectional view taken along the line A–A' in FIG. 3), the piezoelectric laminated body constituting the thin-film piezoelectric-member element 10 is constituted by joining a first thin-film piezoelectric-member layer 11A, on whose upper face an upper electrode (electrode metallic film) 12B is formed and on whose lower face a lower electrode (electrode metallic film) 12A is formed, with a second thin-film piezoelectric-member layer 11B on whose upper face a lower electrode (electrode metallic film) 12C is formed and on whose lower face an upper electrode (electrode metallic film) 12D is formed by an adhesive 18 so that an upper electrode film 12B and an upper electrode film 12D face each other.

The first and second thin-film piezoelectric-member layers 11A and 11B are constituted so that they are changed in the same direction when grounding the upper electrode films 12B and 12D and applying the same voltage to the lower electrode film 12A of the first thin-film piezoelectric-member layer 11A and the lower electrode (electrode metallic film) 12C of the second thin-film piezoelectric-member layer 11B. In this case, the change in the same direction means that when the first thin-film piezoelectric-member layer 11A is extended, the second thin-film piezoelectric-member layer 11B is also extended. Similarly, when the first thin-film piezoelectric-member layer 11A is contracted, the second thin-film piezoelectric-member layer 11B is also contracted.

Moreover, the thin-film piezoelectric-member element 10 is entirely covered with flexible coating resins 41 and 50.

Furthermore, the lower electrode 12C of the thin-film piezoelectric-member element 10A is electrically separated from the lower electrode 12C of the thin-film piezoelectric-member element 10B, and the lower electrode 12A of the thin-film piezoelectric-member element 10A is electrically separated from the lower electrode 12A of the thin-film piezoelectric-member element 10B.

Figure 2:
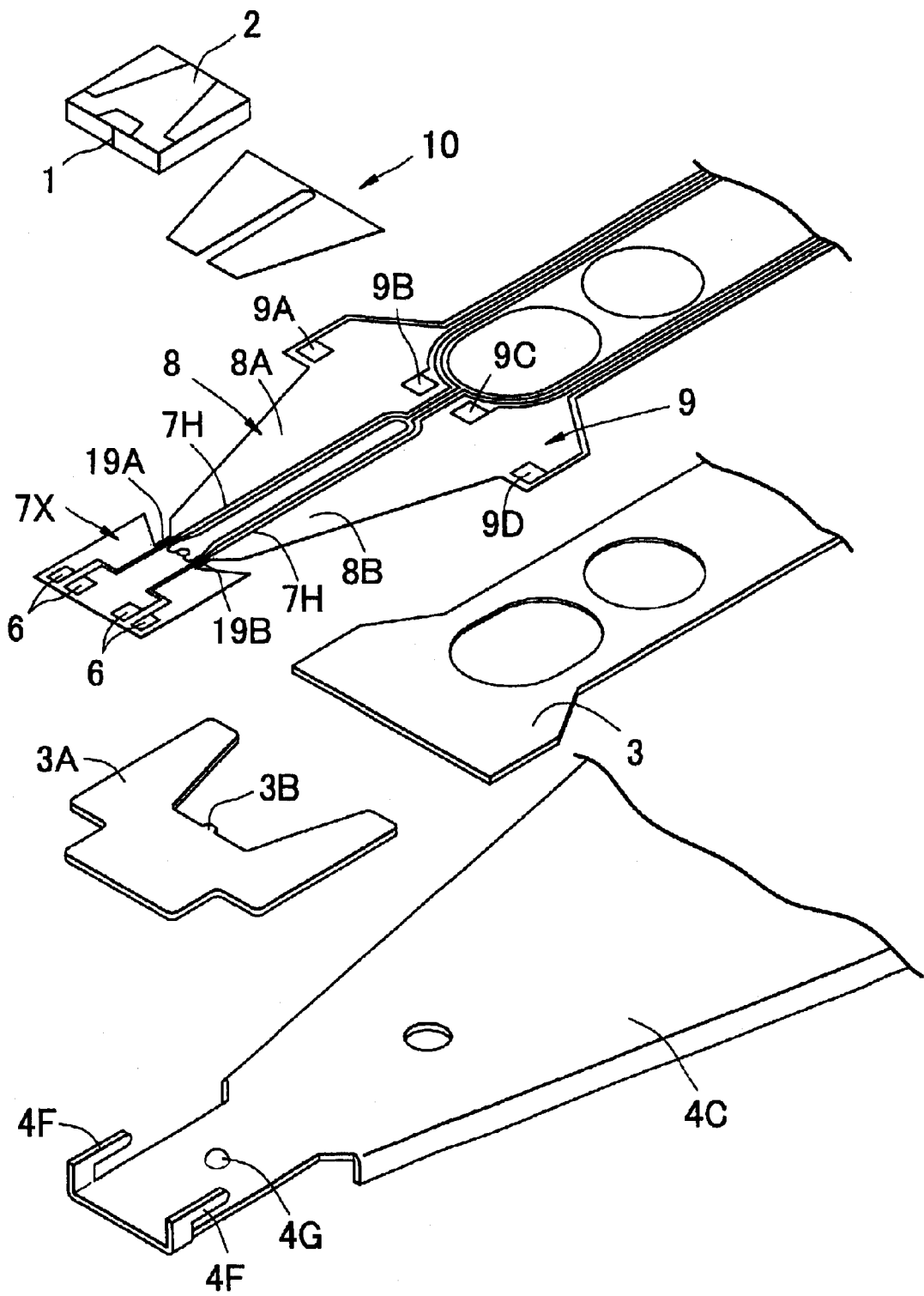
FIG. 2 is an exploded perspective view of the head-supporting mechanism of the embodiment 1.
Figure 5:
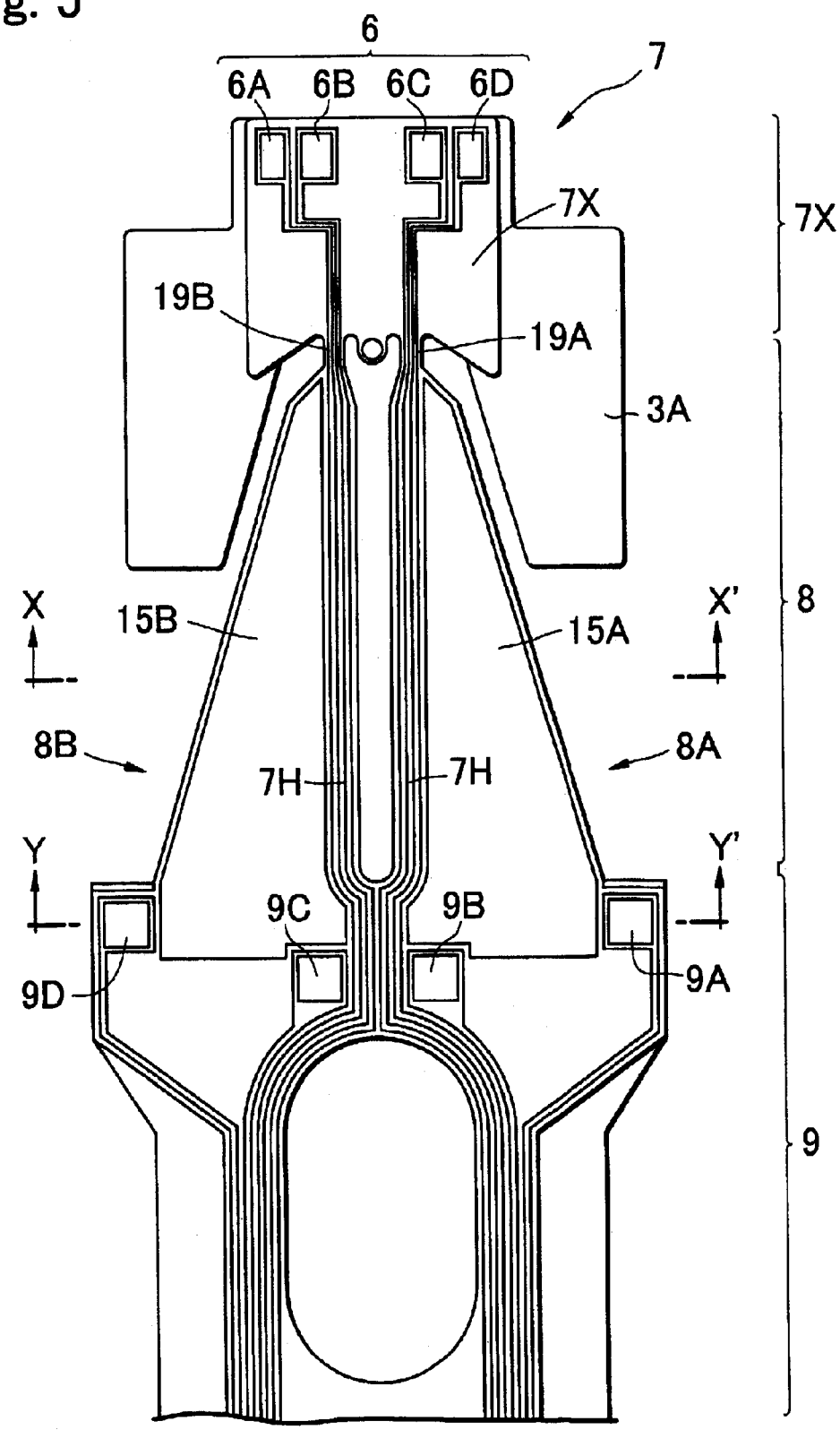
FIG. 5 is a top view of a flexure used for the head-supporting mechanism of the embodiment 1.
Figure 6:
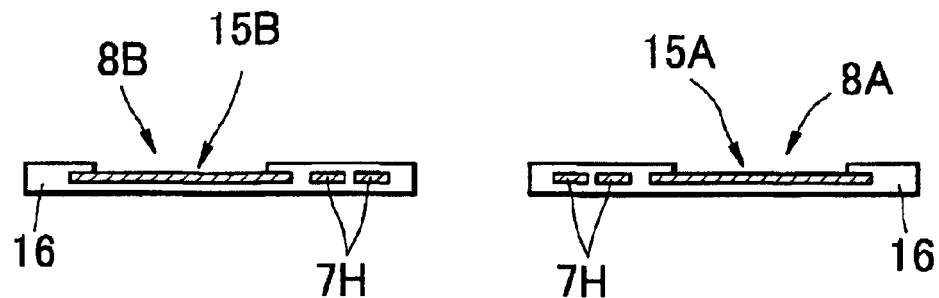
FIG. 6 is a sectional view of the flexure in FIG. 5 taken along the line X–X' of FIG. 5.

Moreover, in the head-supporting mechanism portion of this embodiment 1, the flexure 7, as shown in FIGS. 2 and 5, is a flexible film-like substrate in which a metallic wiring 7H connected to the magnetic head 1 and a metallic plate 15 (15A, 15B), which forms the piezoelectric-member-driving portion 100 by being pasted with the thin-film piezoelectric-member element 10, are held by an insulating material 16 made of a polyimide resin or the like as shown in FIG. 6 (sectional view taken along the line X–X' in FIG. 5). The flexure 7 includes a slider-setting portion 7X, a wiring portion 9, and a thin-film piezoelectric-member-pasting portion 8 (8A, 8B) located between the slider-setting portion 7X and the wiring portion 9.

In this case, the metallic plates 15A and 15B are formed into flat shapes almost the same as the thin-film piezoelectric-member elements 10A and 10B, respectively, and are arranged on the piezoelectric-member-pasting portion 8 so as to face the thin-film piezoelectric-member elements 10A and 10B, respectively.

Moreover, in the case of the flexure 7, first and second thin-film piezoelectric-member terminals 9A and 9D are formed near the boundary between the wiring portion 9 and the thin-film piezoelectric-member-pasting portions 8A and 8B so as to be close to signal terminal portions 40 of the thin-film piezoelectric-member elements 10A and 10B and the thin-film piezoelectric-member terminals 9B and 9C are formed nearby the boundary between the wiring portion 9 and thin-film piezoelectric-member-pasting portion 8 so as to approach the ground terminal portion 30 common to two thin-film piezoelectric-member elements.

Either of the third and fourth thin-film piezoelectric-member terminals 9B and 9C may be connected to the common ground terminal portion 30, or one terminal may be used as a thin-film piezoelectric-member terminal.

Moreover, a magnetic-head terminal 6 acts as a connection-terminal electrode for the metallic wiring to connect with an input/output terminal of the magnetic head 1.

Figure 7:
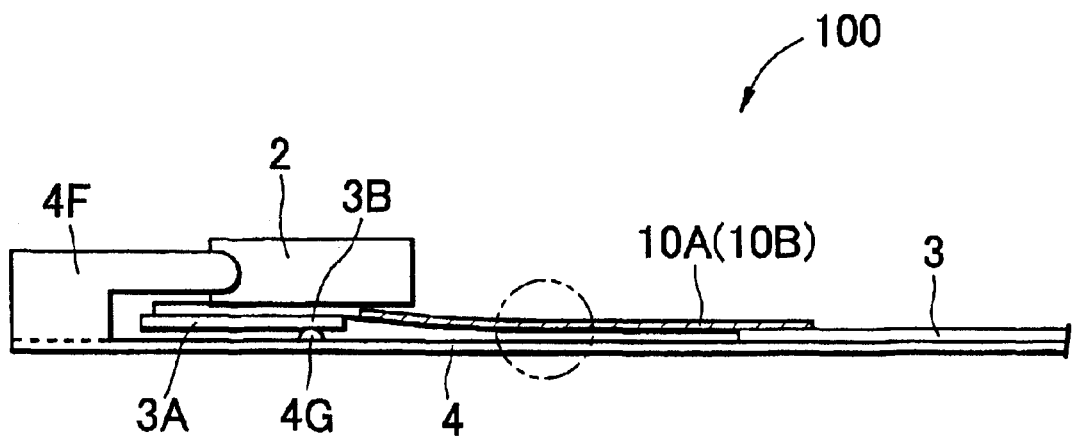
FIG. 7 is a side view of the head-supporting mechanism of the embodiment 1.

The piezoelectric-member thin-film element 10 and flexure 7 arranged as described above are combined with other components on the load beam 4 as shown in FIGS. 2 and 7.

The thin-film piezoelectric-member element 10 is pasted onto the thin-film piezoelectric-member-pasting portion 8 of the flexure 7 so that the thin-film piezoelectric-member elements 10A and 10B face the metallic plates 15A and 15B, respectively. Moreover, the slider 2 is set onto the slider-setting portion 7X of the flexure 7 (magnetic head 1 is mounted to slider 2), a slider-holding plate 3A is set at the side opposite to the slider 2 (lower face of the slider-setting portion 7), and a wiring-holding plate 3 is set below the wiring portion 9 of the flexure 7. The slider 2 is set on the load beam 4 so that the slider 2 is located at the front end of the load beam 4.

The slider-holding plate 3A and wiring-portion-holding plate 3 are formed by stainless-steel plates having the same thickness.

In this case, a protrusion 3B is formed on the slider-holding plate 3A as shown in FIG. 2. Moreover, a dimple 4G is formed at the front end of the load beam 4, and the slider-holding plate 3A is held so as to be rotatable about the dimple 4G when the protrusion 3B is pressed by the dimple 4G.

The head-supporting mechanism portion of the embodiment 1 constituted as described above can be operated as described below.

Figure 8:
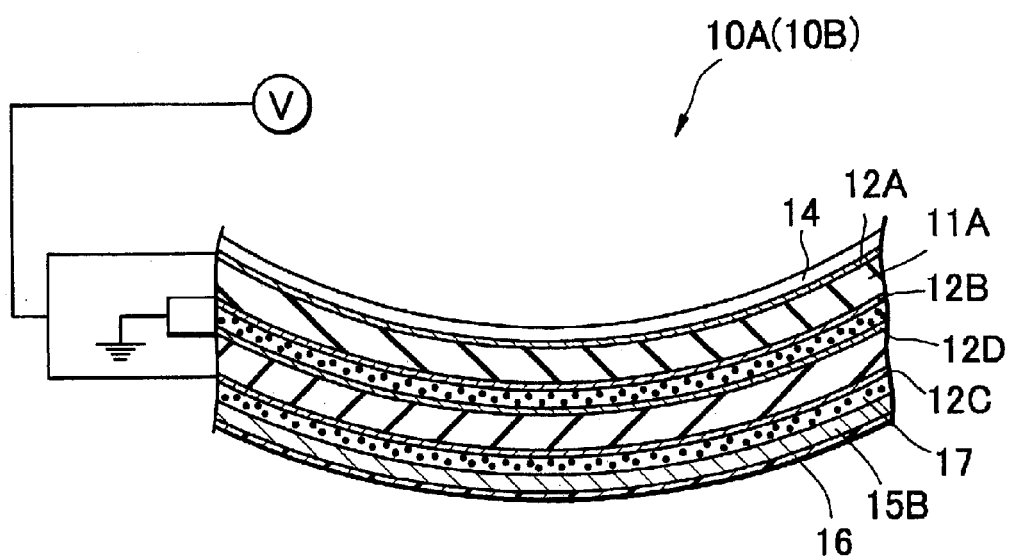
FIG. 8A is a sectional view for explaining operations of the piezoelectric-driving portion of the head-supporting mechanism of the embodiment 1.
FIGS. 8B and 8C are graphs showing waveforms of voltages to be applied.
Figure 8:
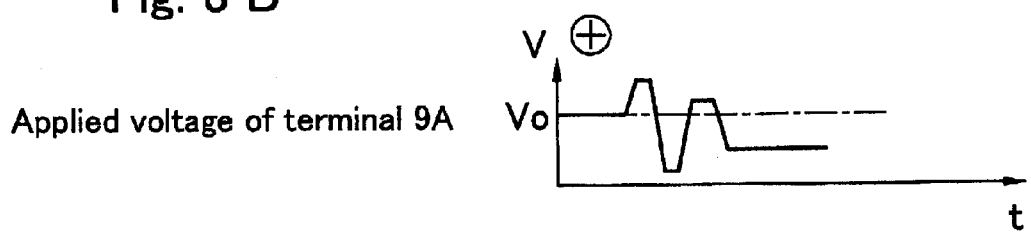
Figure 8:
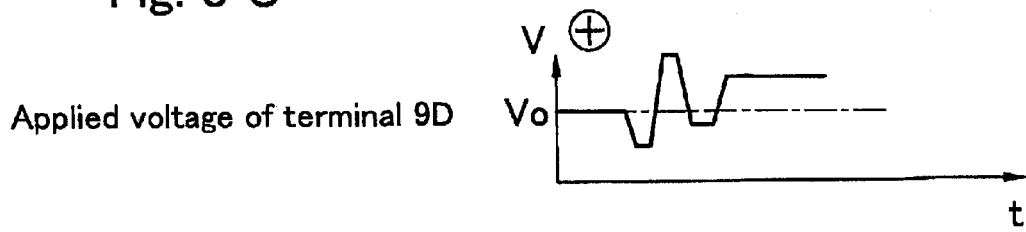

The thin-film piezoelectric-member terminals 9B and 9C serving as ground terminals are grounded as shown in FIG. 8A, and voltages having phases opposite to each other about the bias voltage V0 are applied to the thin-film piezoelectric-member terminals 9A and 9D as shown in FIGS. 8B and 8C.

Figure 9:
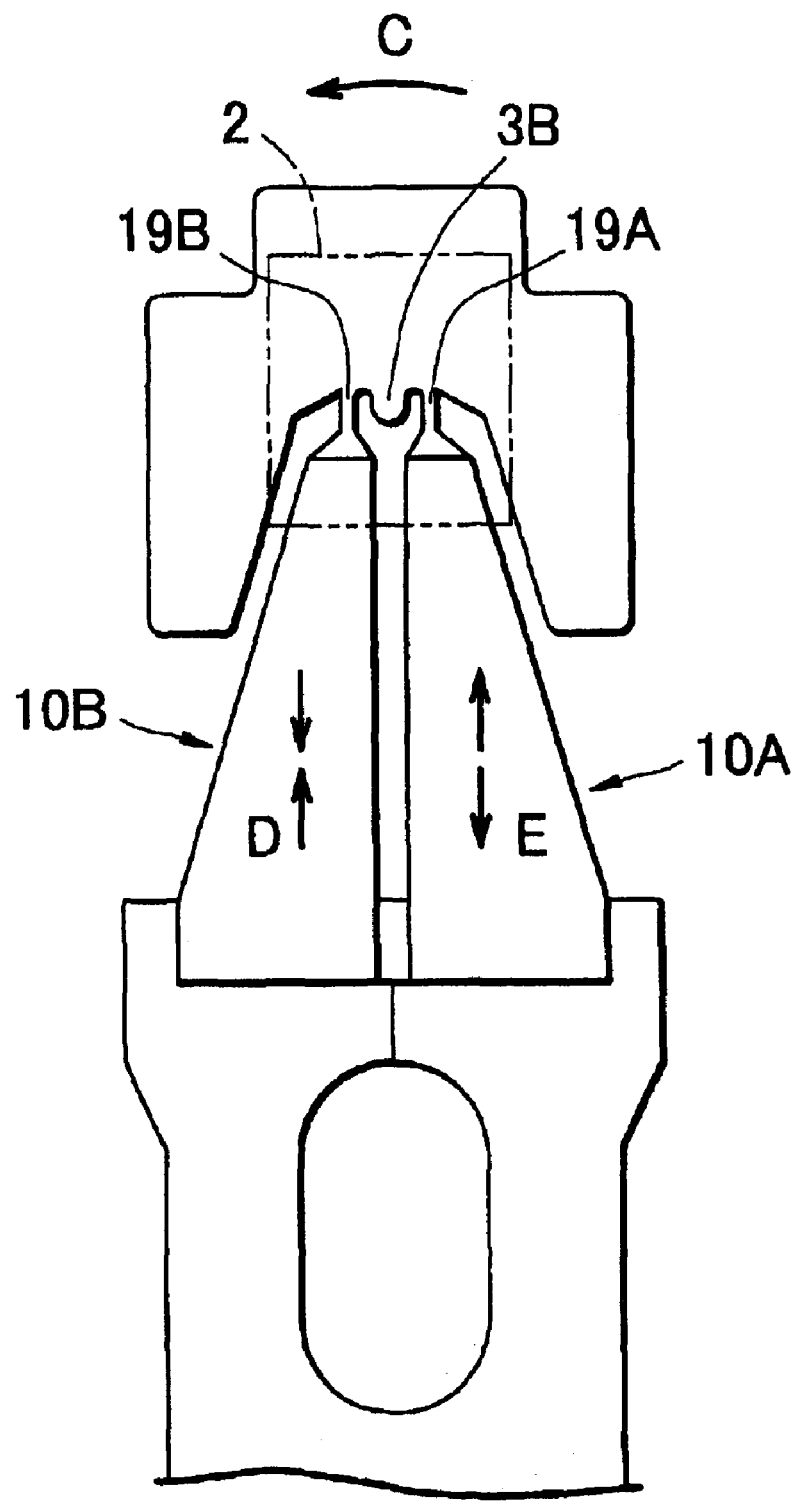
FIG. 9 is a top view for explaining operations of the head-supporting mechanism of the embodiment 1.

Thus, the degrees of curvature of the thin-film piezoelectric-member elements 10A and 10B are changed while they are always curved in the same direction corresponding to a voltage applied to the thin-film piezoelectric-member terminals 9A and 9D. Thus, as shown in FIG. 9A, when the thin-film piezoelectric-member element 10A is slightly curved and the thin-film piezoelectric-member element 10B is greatly curved, the portion shown as 19A is loosened and the portion shown as 19B is pulled and so that the slider-holding plate 3A can be rotated.

The head-supporting-mechanism portion constituted as described above to position a magnetic head by using a thin-film piezoelectric element can accurately position a magnetic head compared with a supporting mechanism for positioning a magnetic head by using a conventional voice coil motor or a head-supporting mechanism using another piezoelectric element.

The connection between the terminal configuration of the thin-film piezoelectric element 10 (which is a characteristic portion of the head-supporting mechanism of this embodiment 1) and the thin-film piezoelectric-member terminals 9A to 9D is described below.

Figure 10:
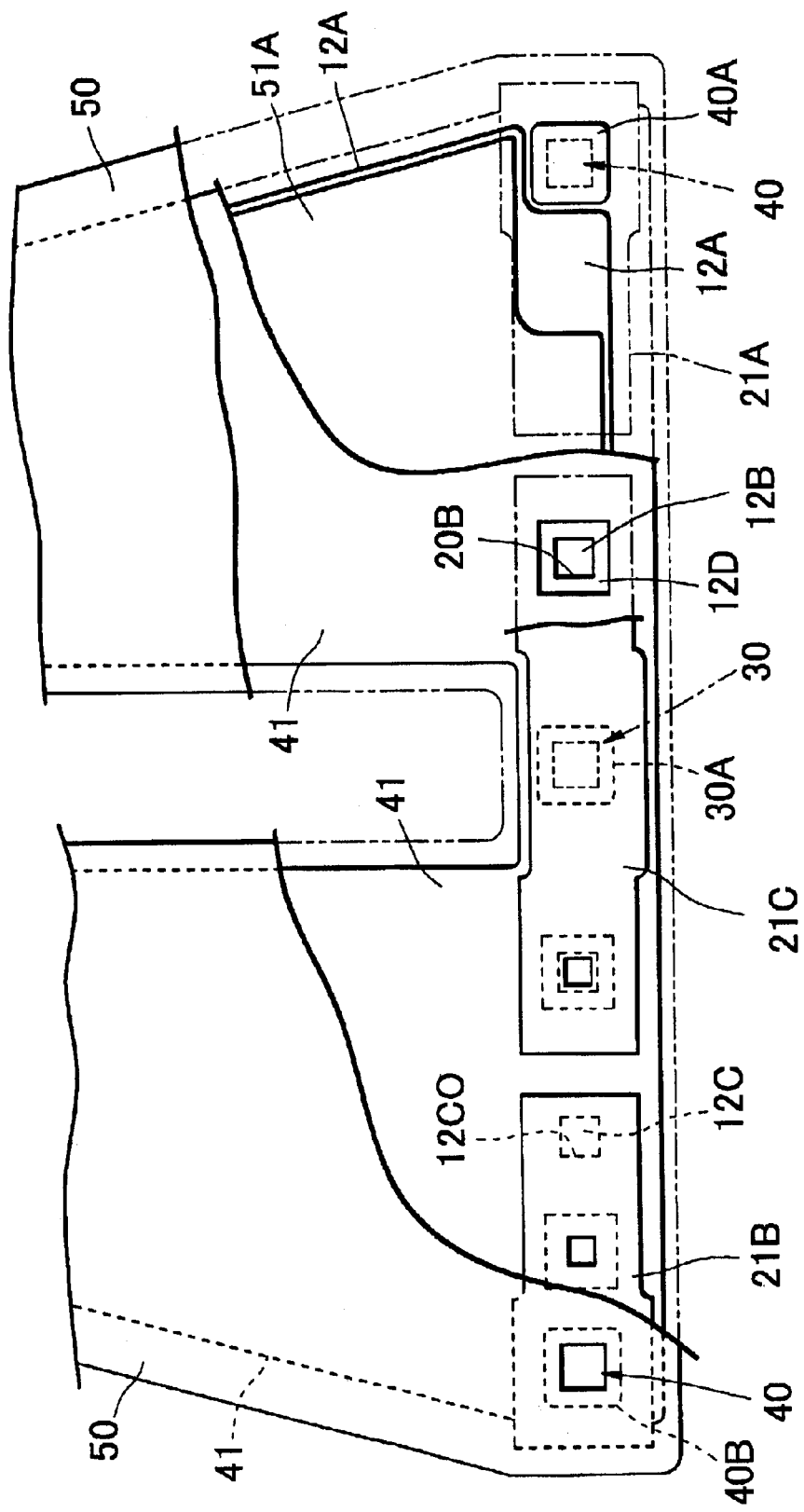
FIG. 10 is a local perspective top view showing an electrode configuration of a thin-film piezoelectric-member element used for the head-supporting mechanism of the embodiment 1.
Figure 11:
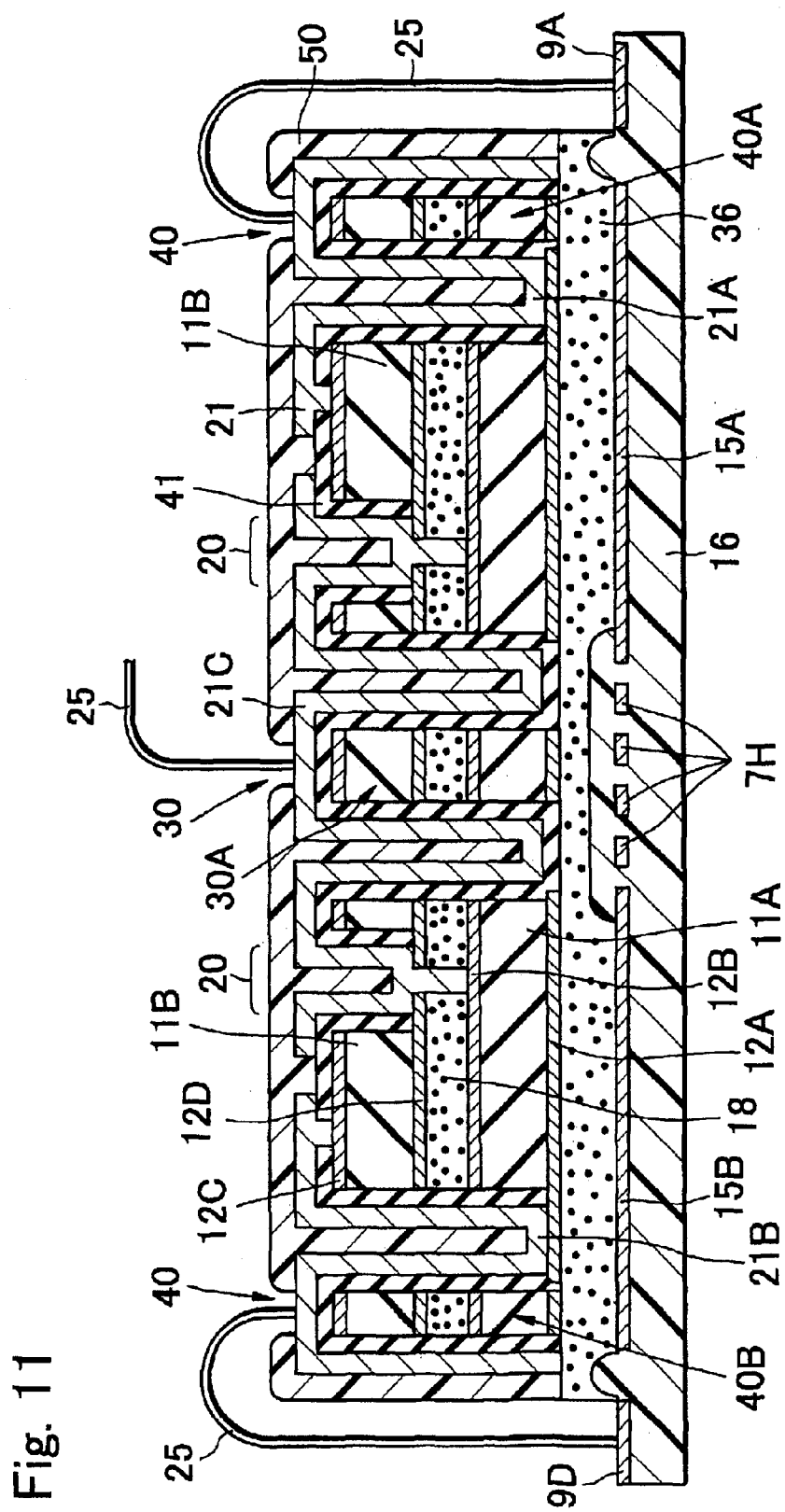
FIG. 11 is a sectional view showing an electrode configuration of a thin-film piezoelectric-member element used for the head-supporting mechanism of the embodiment 1.

FIG. 10 is a transmission view showing the terminal structure of the thin-film piezoelectric-member element 10 in detail, and FIG. 11 is a sectional view of the terminal structure.

The sectional view of FIG. 11 is a sectional view (taken along the line Y–Y' in FIG. 5) after the thin-film piezoelectric-member element 10 is connected with the flexure 7.

As described above, the piezoelectric-member thin-film element 10 of this embodiment 1 is constituted by two piezoelectric-member thin-film elements 10A and 10B that can be independently driven.

In the case of this embodiment 1, these two piezoelectric-member thin-film elements 10A and 10B are formed by dividing a trapezoidal piezoelectric laminated body into two parts at its central portion, and an external-connection electrode for two piezoelectric-member thin-film elements 10A and 10B is formed at a portion along the lower bottom of the trapezoidal piezoelectric laminated body.

A fabrication method of the piezoelectric-member-driving portion 100 of this embodiment 1 and a detailed configuration of the piezoelectric-member-driving portion 100 are clarified by explaining the method and the configuration while referring to FIGS. 12 to 23.

The thin-film piezoelectric-member elements 10A and 10B have the same structure (symmetric with respect to the right and left sides) as shown in FIG. 11. Therefore, portions of the thin-film piezoelectric-member element 10B are omitted in the following drawings for explaining this fabricating method.

(Film-Forming Step)

Figure 12:
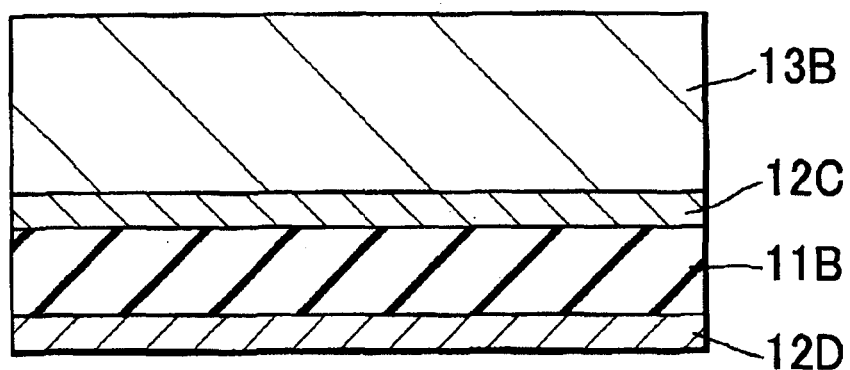
FIG. 12 is a first sectional view for explaining a film-forming step of an electrode and a thin-film piezoelectric member in a method for fabricating the piezoelectric driving portion of the embodiment 1.

As shown in FIG. 12, in the case of the fabricating method of this first embodiment, the electrode metallic film 12C, thin-film piezoelectric member 11B, and electrode metallic film 12D are formed on one principal plane of a single-crystal substrate 13B in order from the single-crystal substrate 13B.

Figure 13:
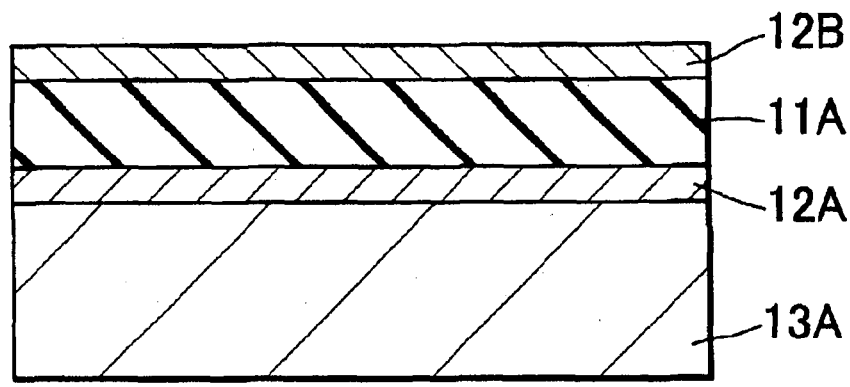
FIG. 13 is a second sectional view for explaining a film-forming step of an electrode and a thin-film piezoelectric member in a method for fabricating the piezoelectric driving portion of the embodiment 1.

As shown in FIG. 13, the electrode metallic film 12A, thin-film piezoelectric member 11A, and electrode metallic film 12B are formed on one principal plane of a single-crystal substrate 13A in order from the single-crystal substrate 13A.

(Bonding Step)

Figure 14:
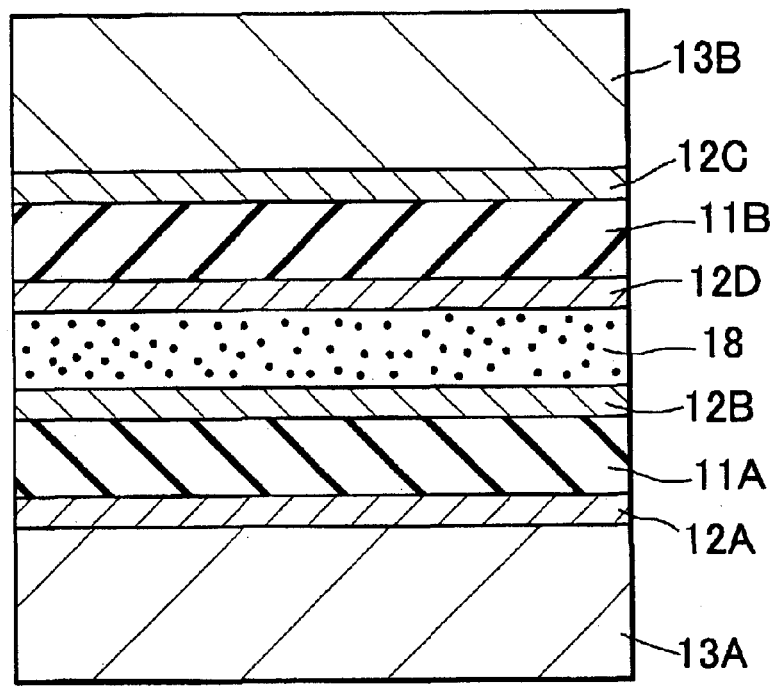
FIG. 14 is a sectional view for explaining a bonding step in a method for fabricating the piezoelectric driving portion of the embodiment 1.

Then, as shown in FIG. 14, the single-crystal substrates 13A and 13B are bonded to each other by an adhesive layer 18 by facing the electrode metallic films 12D and 12B toward each other. Thus, a laminated body is constituted in which the electrode metallic film 12A, thin-film piezoelectric member 11A, electrode metallic film 12B, adhesive layer 18, electrode metallic film 12D, thin-film piezoelectric member 11B, and electrode metallic film 12C are laminated in this order.

Though bonding is performed by the adhesive layer 18 in the case of this first embodiment, it is also possible to bond the electrode metallic films 12D and 12B to each other by thermal welding using ultrasonic vibrations.

Figure 15:
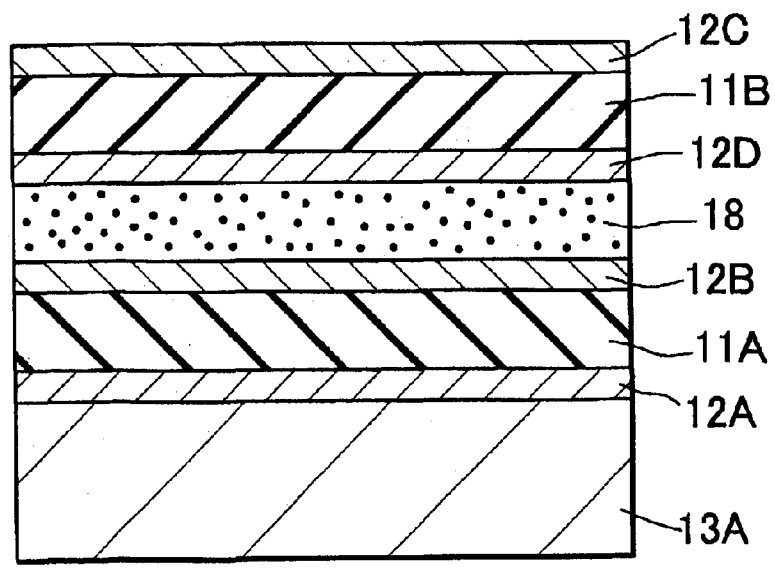
FIG. 15 is a sectional view showing a state in which a substrate is removed after being bonded in a method for fabricating the piezoelectric driving portion of the embodiment 1.
Figure 16:
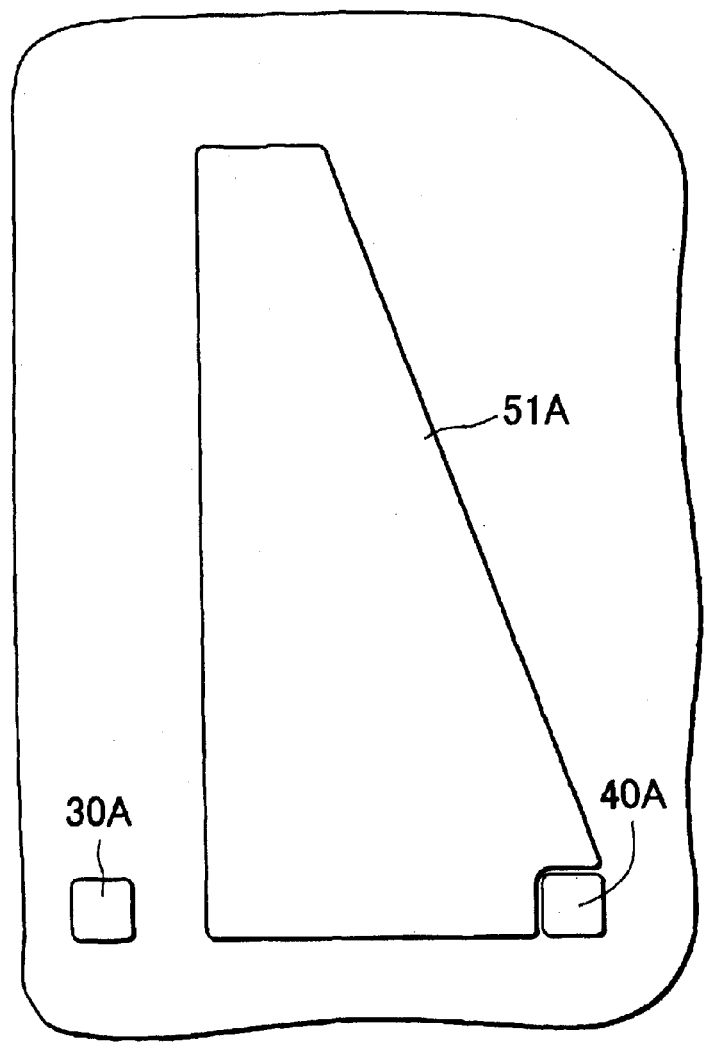
FIGS. 16A and 16B are a top view and a sectional view for explaining a first etching step in a method for fabricating the piezoelectric driving portion of the embodiment 1.
Figure 16:
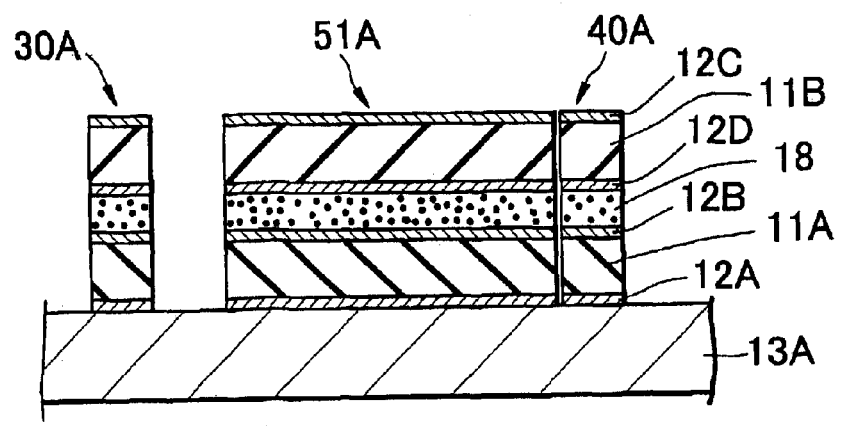
Figure 17:
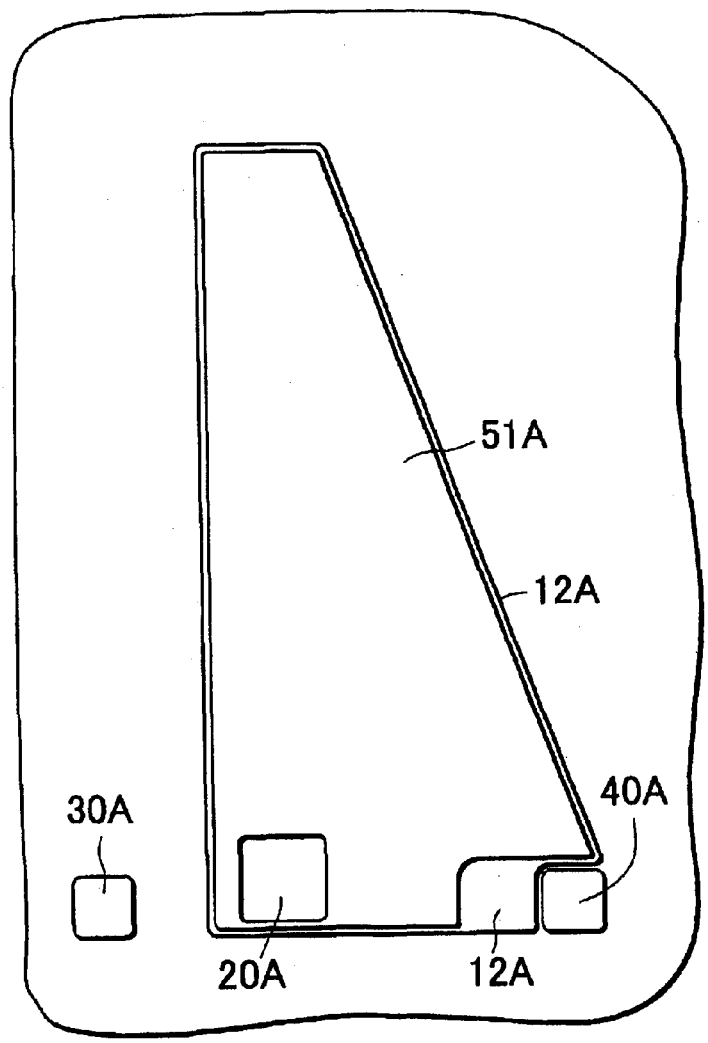
FIGS. 17A and 17B are a top view and a sectional view for explaining second and third etching steps in a method for fabricating the piezoelectric driving portion of the embodiment 1.
Figure 17:
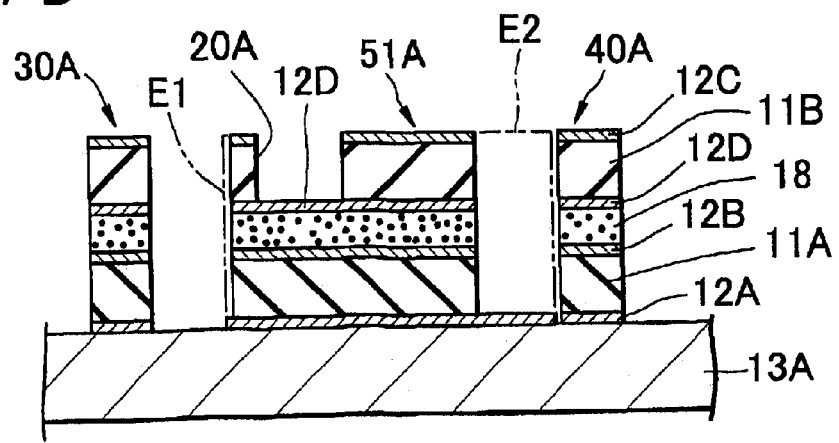
Figure 18:
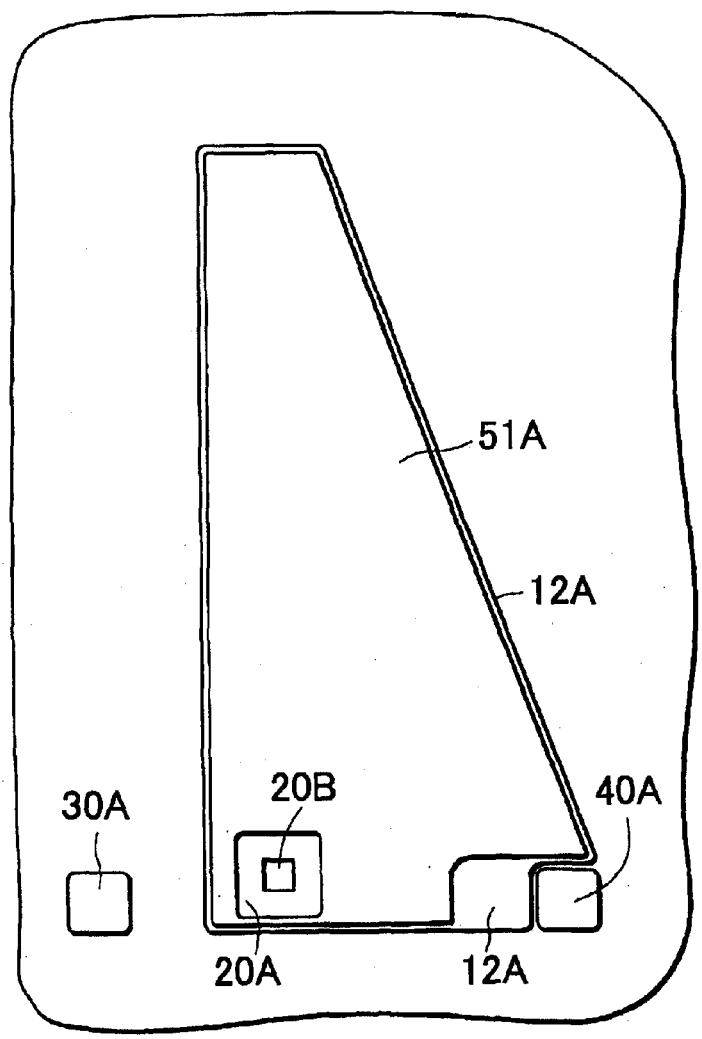
FIGS. 18A and 18B are a top view and a sectional view for explaining a fourth etching step in a method for fabricating the piezoelectric driving portion of the embodiment 1.
Figure 18:
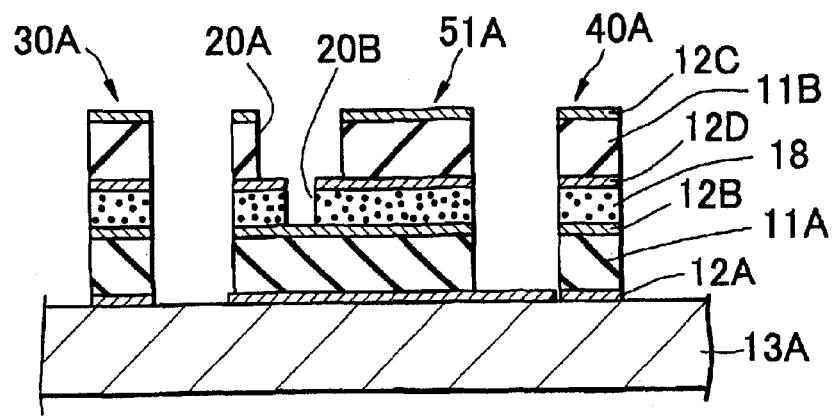
Figure 19:
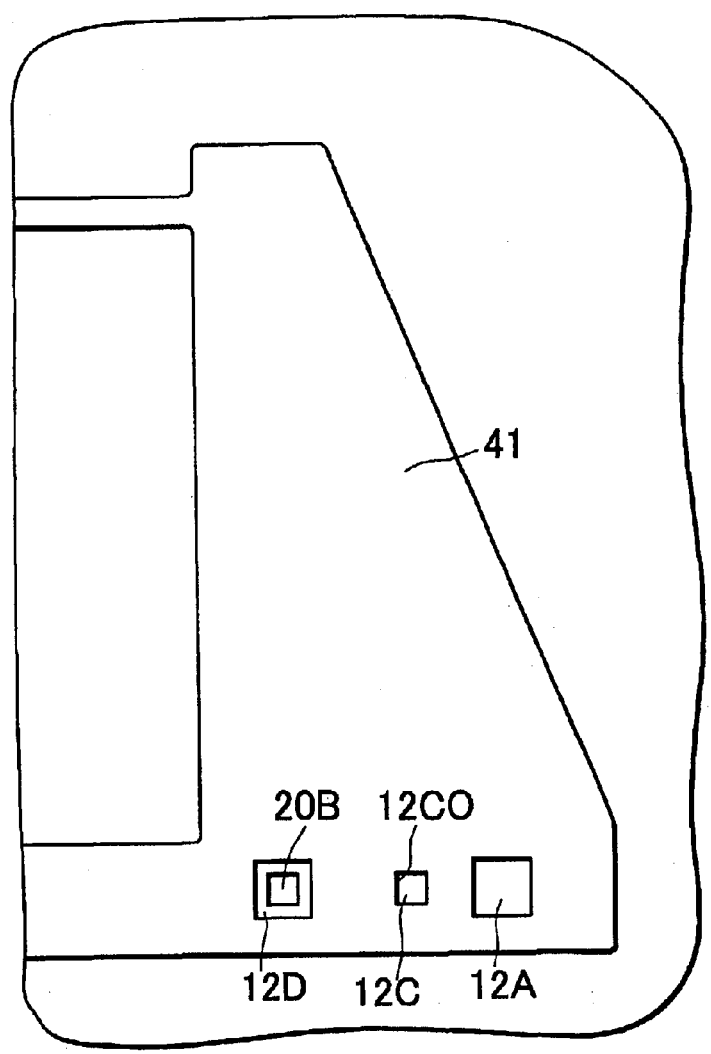
FIGS. 19A and 19B are a top view and a sectional view for explaining a first coating-film-forming step in a method for fabricating the piezoelectric driving portion of the embodiment 1.
Figure 19:
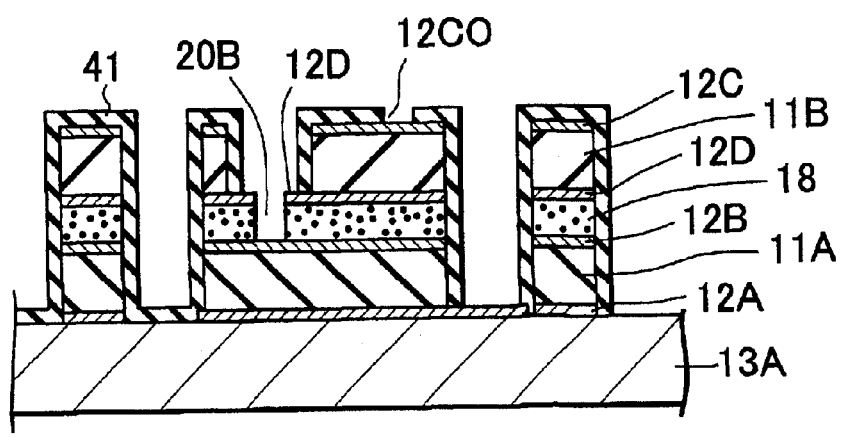
Figure 20:
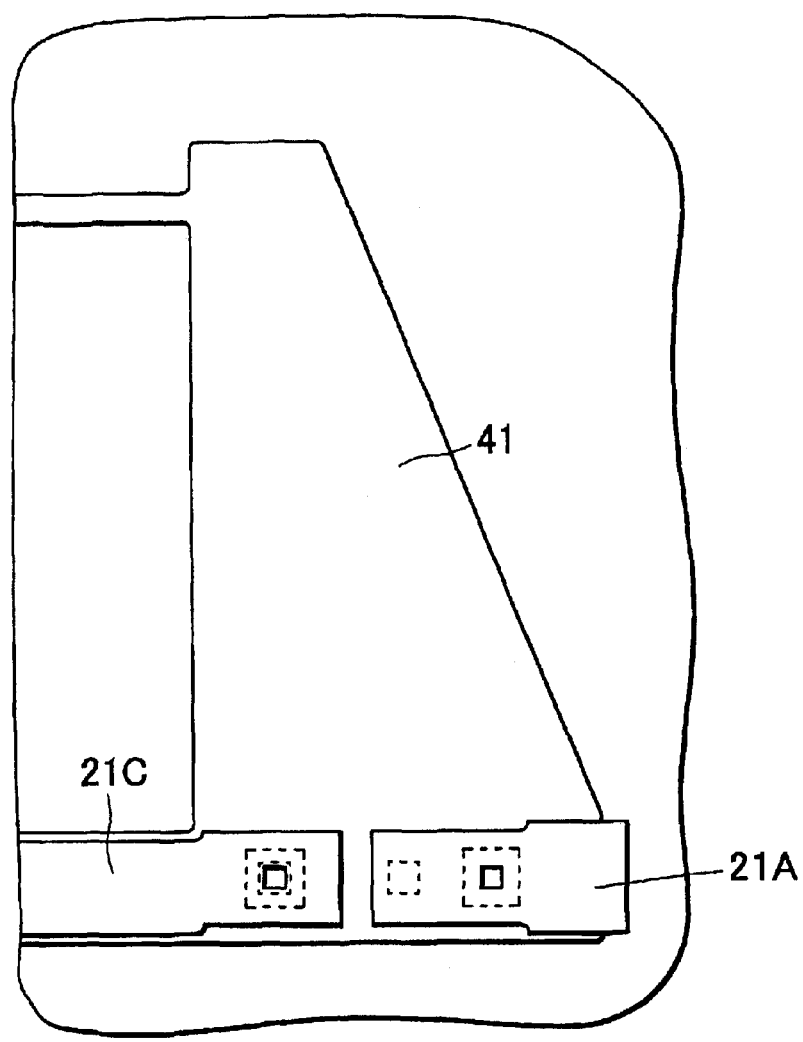
FIGS. 20A and 20B are a top view and a sectional view for explaining a metallic-terminal-film-forming step in a method for fabricating the piezoelectric driving portion of the embodiment 1.
Figure 20:
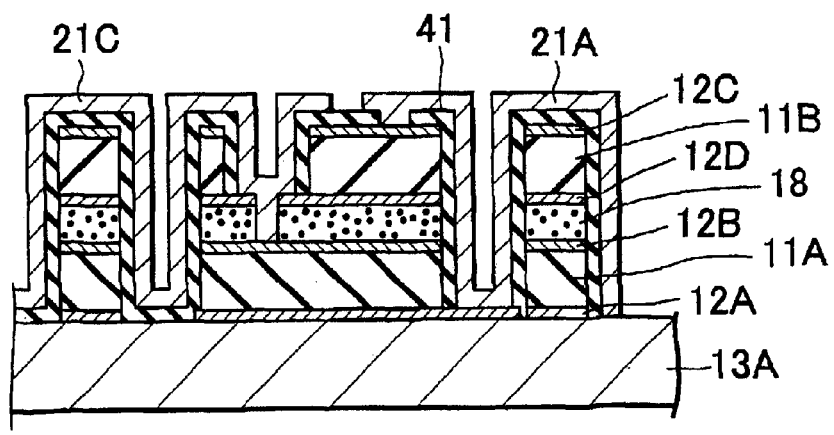
Figure 21:
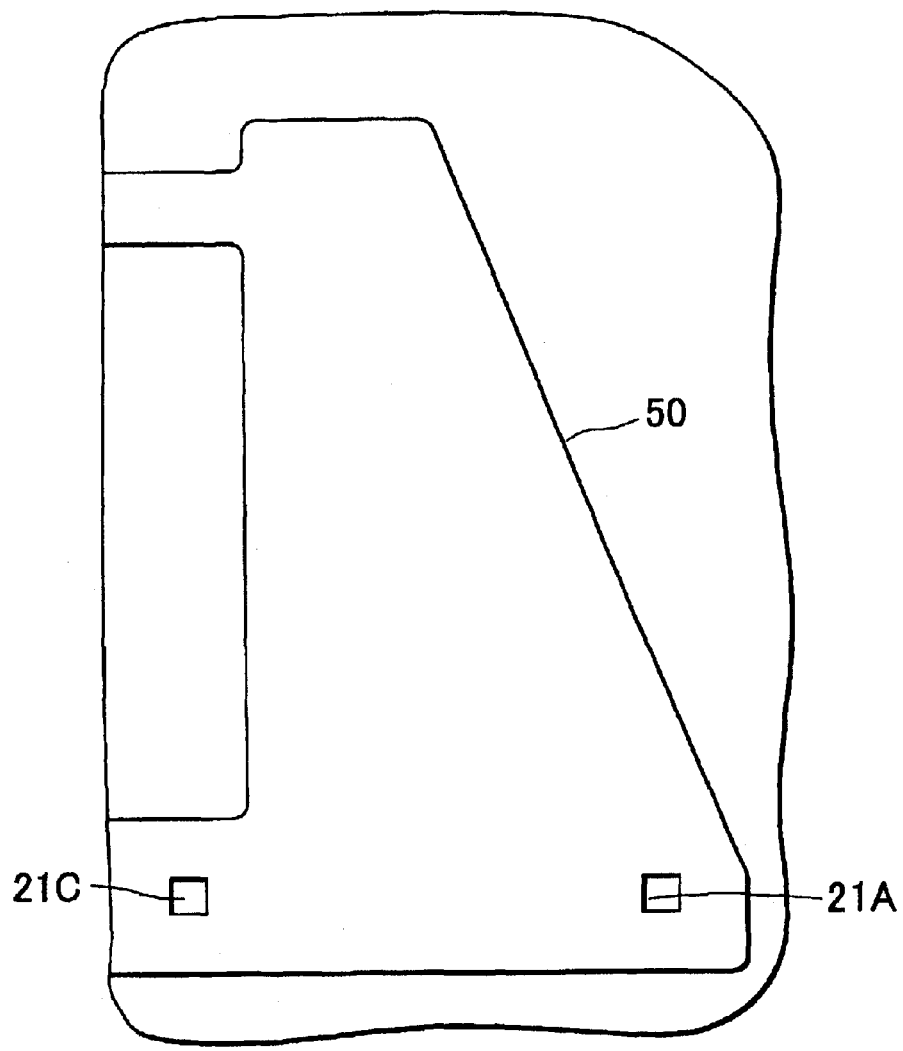
FIGS. 21A and 21B are a top view and a sectional view for explaining a second coating-film-forming step in a method for fabricating the piezoelectric driving portion of the embodiment 1.
Figure 21:
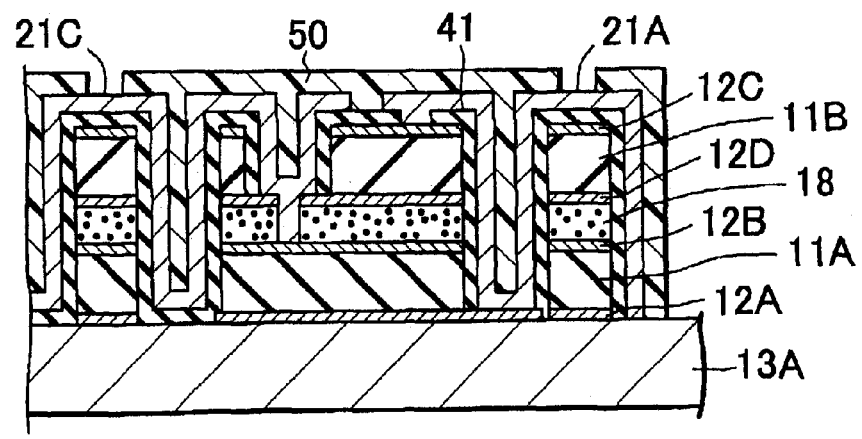

Then, as shown in FIG. 15, one single-crystal substrate 13B is removed through etching.

(First Etching Step)

Then, as shown by the top view in FIG. 16A and the sectional view in FIG. 16B, the laminated body is divided into piezoelectric displacement regions 51A and 51B (not illustrated), a signal-terminal piezoelectric-member pedestal 40A, and a ground-terminal piezoelectric-member pedestal 30A.

(Second Etching Step)

Then, as shown by the top view in FIG. 17A and the sectional view in FIG. 17B, the electrode metallic film 12A is exposed around the piezoelectric displacement region 51A through etching (by removing the portions shown by symbols E1 and E2 in FIG. 17B).

The portion shown by the symbol E2 in FIG. 17B is set so that the width of the electrode metallic film 12A (connective portion) exposed by removing the portion E2 is larger than the width of the electrode metallic film exposed around the piezoelectric displacement region 51A.

(Third Etching Step)

Then, as shown by the top view in FIG. 17A and the sectional view in FIG. 17B, a concave portion 20A is formed by removing the electrode metallic film 12C and thin-film piezoelectric member 11B through etching at the portion close to the ground terminal region 30A of the piezoelectric displacement region 51A so that the electrode metallic film 12D is expose at the bottom of the concave portion 20A.

(Fourth Etching Step)

Then, as shown in FIGS. 18A and 18B, a concave portion 20B is formed by removing the electrode metallic film 12D and adhesive layer 18 at the bottom of the concave portion 20A through etching so that the electrode metallic film 12B is exposed at the bottom of the concave portion 20B.

The concave portion 20B is formed at the central portion of the bottom of the concave portion 20A, and the electrode metallic film 12D is exposed around the concave portion 20B so that at least the electrode metallic film 12D can be securely connected by a metallic terminal film 21C to be described later.

(First Coating-Film-Forming Step)

Then, as shown in FIGS. 19A and 19B, a coating film 41 is formed so as to almost entirely cover the thin-film piezoelectric-member element 10 except exposing the following portions.

Portions exposed without forming the coating film 41 are:

(i) the electrode metallic film 12B at the bottom of the concave portion 20B;

(ii) the electrode metallic film 12D around he concave portion 20B (electrode metallic film 12D around the concave portion 20B exposed at the bottom of the concave portion 20A);

(iii) the electrode metallic film 12A exposed adjacent to the signal-terminal piezoelectric-member pedestal 40A; and (iv) the electrode metallic film 12C exposed by an opening 12CO formed in the coating film 41 so as to approach the electrode metallic film 12A between the concave portion 20A and the electrode metallic film 12A exposed adjacent to the signal-terminal piezoelectric-member pedestal 40A.

(Metallic-Terminal-Film Formation)

Then, as shown in FIGS. 20A and 20B, the metallic terminal film 21C is connected to the electrode metallic film 12B (i) at the bottom of the concave portion 20B, is connected to the electrode metallic film 12D (ii) exposed around the concave portion 20B, and is formed so as to extend onto the ground-terminal region 30A. In addition, a metallic terminal film 21A is connected to (iii) the electrode metallic film 12A exposed adjacent to the signal-terminal piezoelectric-member pedestal 40A, is connected to (iv) the electrode metallic film 12A exposed by the opening 12CO, and is formed so as to extend onto the signal-terminal piezoelectric-member pedestal 40A.

(Second Coating-Film-Forming Step)

Then, as shown in FIGS. 21A and 21B, a coating film 50 almost entirely covering the thin-film piezoelectric-member element 10 is formed so as to expose the metallic terminal film 21C formed on the ground-terminal piezoelectric-member pedestal 30A, and so as to expose the metallic terminal film 21A formed on the signal-terminal piezoelectric-member pedestal 40A.

(Transferring Step)

Figure 22:
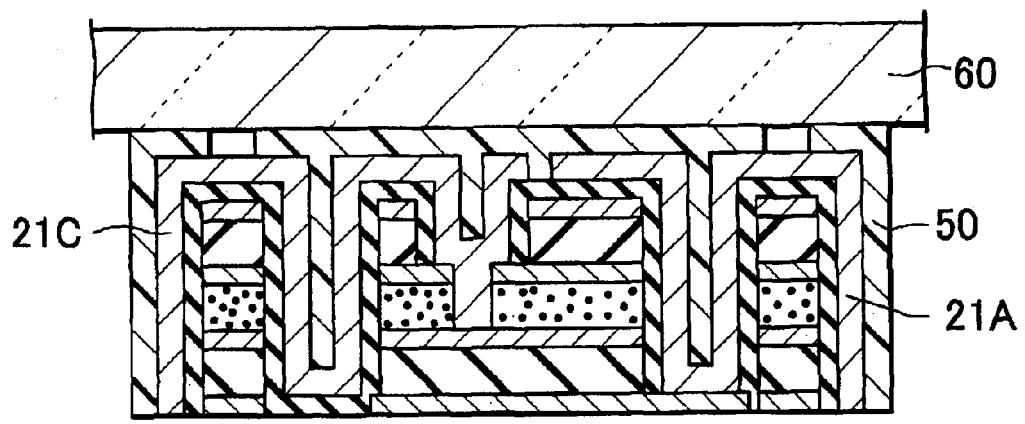
FIG. 22 is a sectional view for explaining a transferring step in a method for fabricating the piezoelectric driving portion of the embodiment 1.

Then, as shown in FIG. 22, a transferring substrate 60 is joined onto the coating film 50. The single-crystal substrate 13A is then removed through, for example, etching, and the transferring substrate 60 is also removed.

Figure 23:
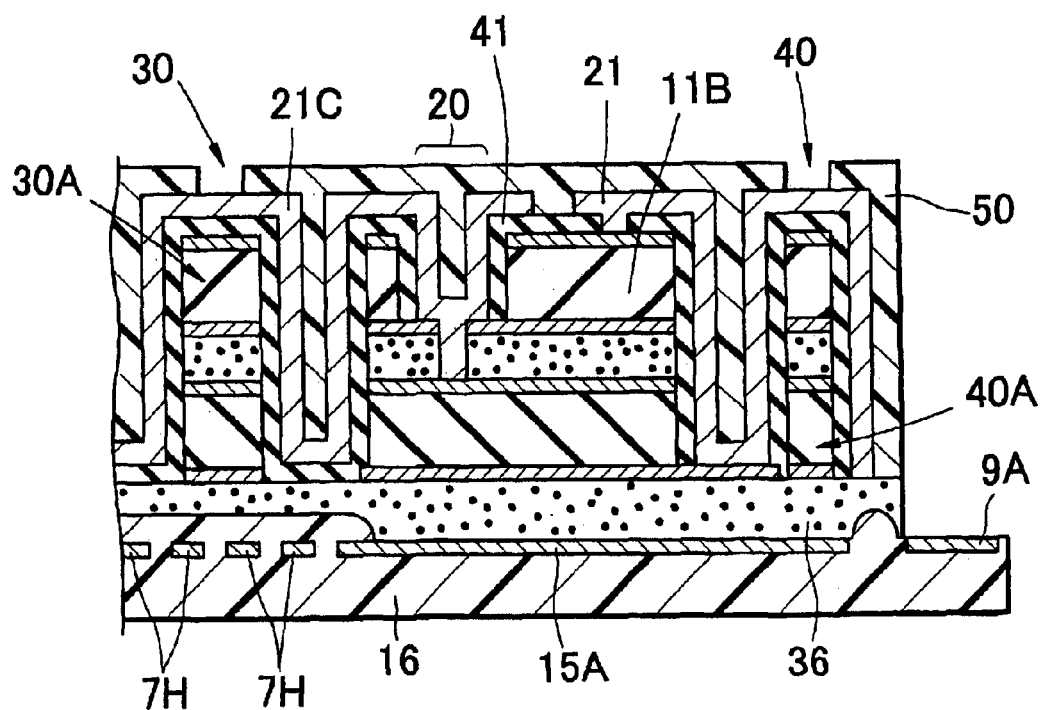
FIG. 23 is a sectional view showing a state after transferring in a method for fabricating the piezoelectric driving portion of the embodiment 1.

Then, as shown in FIG. 23, a flexure 7 serving as a non-retractable substrate that can be deflection-deformed is joined to the side opposite from where the substrate 60 is removed (i.e., where the single-crystal substrate 13A had been located).

(Wire-Bonding Step)

Then, the wire-bonding portions 40 formed by surfaces of the metallic terminal films 21A and 21B exposed on the signal-terminal piezoelectric-member pedestals 40A and 40B, respectively, are connected with the signal terminals 9A and 9D by a wire 25 as shown in FIG. 11. Similarly, the wire-bonding portion 30 formed by the surface of the metallic terminal film 21C exposed on the signal-terminal piezoelectric-member pedestal 30A is connected with the ground terminal 9B or 9C by the wire 25. In this case, any one of various bonding machines including an ultrasonic bonding machine can be used in this bonding step.

In this case, any one of various bonding machines including an ultrasonic bonding machine can be used in this bonding step.

Thus, as shown in FIG. 11, the thin-film piezoelectric-member element 10 is joined onto the thin-film-piezoelectric-member-pasting portion 8 of the flexure 7, so that the piezoelectric-member-driving portion of this embodiment 1 is formed.

In the case of the piezoelectric-member-driving portion of the head-supporting mechanism of the first embodiment thus constituted, because the piezoelectric displacement regions 51A and 51B are separated from the terminal piezoelectric-member pedestals 30A and 40A on which the wire-bonding portions 30 and 40 are formed, transfer of mechanical impacts or vibrations to the piezoelectric displacement regions 51A and 51B during wire bonding is suppressed due to the separated portions. Therefore, it is possible to prevent the piezoelectric displacement regions 51A and 51B from cracking. As a result, it is possible to fabricate the head-supporting mechanism of this first embodiment at a high yield and secure a high reliability.

Thereby, it is possible to fabricate the head-supporting mechanism of this embodiment 1 at a high yield and secure a high reliability.

Embodiment 2

A head-supporting mechanism of embodiment 2 of the present invention is described below.

The basic configuration of the head-supporting mechanism of the embodiment 2 is the same as that of the head-supporting mechanism portion of the first embodiment except that neither metallic plate 15A nor 15B is provided for the thin-film-piezoelectric-member-pasting portion of the flexure.

That is, in the case of the head-supporting mechanism portion of the first embodiment, the piezoelectric-member-driving portion 100 is constituted by the thin-film piezoelectric-member elements 10A and 10B and the metallic plates 15A and 15B to rotate the slider-holding plate 3A in accordance with the operation of the thin-film piezoelectric-member elements 10A and 10B followed by curves.

However, the head-supporting mechanism portion of this second embodiment is constituted so as to rotate the slider-holding plate 3A by pasting the thin-film piezoelectric-member elements 10A and 10B without using the metallic plates 15A and 15B on polyimide that is more retractable than a metal and, thereby, directly using extension or contraction of the thin-film piezoelectric-member elements 10A and 10B.

More specifically, the piezoelectric-member-driving portion of the embodiment 2 comprising a polyimide substrate and the thin-film piezoelectric-member elements 10A and 10B pasted on the polyimide substrate can directly obtain a driving force for rotating the slider-holding plate 3A in accordance with the extension and contraction of the thin-film piezoelectric-member elements 10A and 10B because the polyimide substrate extends and contracts together with the thin-film piezoelectric-member elements 10A and 10B, though the driving portion is slightly curved due to the extension and contraction of the thin-film piezoelectric-member elements 10A and 10B.

The head-supporting mechanism portion of the second embodiment of the present invention is described below in detail by referring to the accompanying drawings.

In the following drawings, components that are the same as those of the first embodiment (components having the same function though their shapes are different from each other) are provided with the same reference number.

Figure 24:
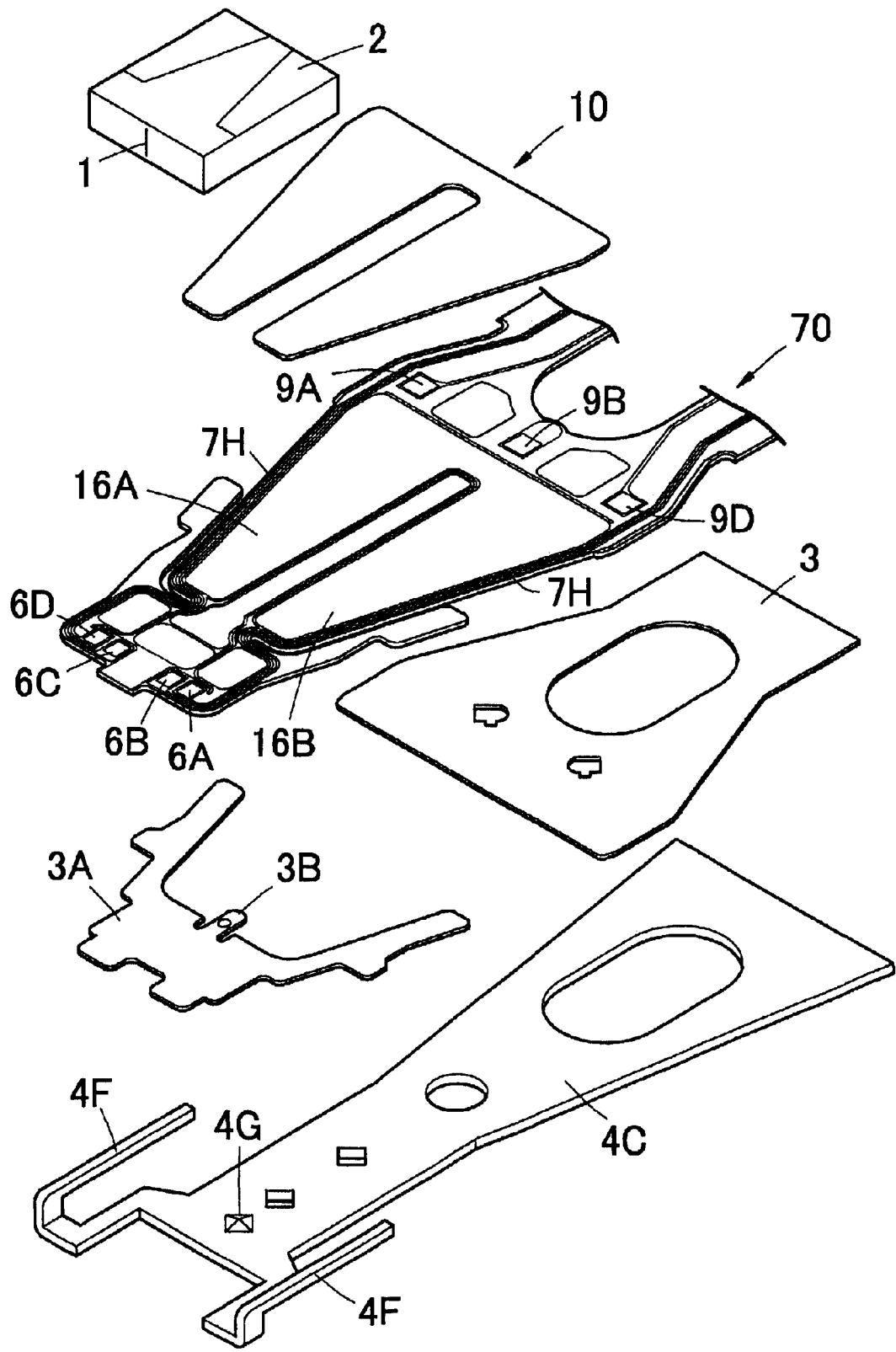
FIG. 24 is an exploded perspective view of a head-supporting mechanism of embodiment 2 of the present invention.
Figure 25:
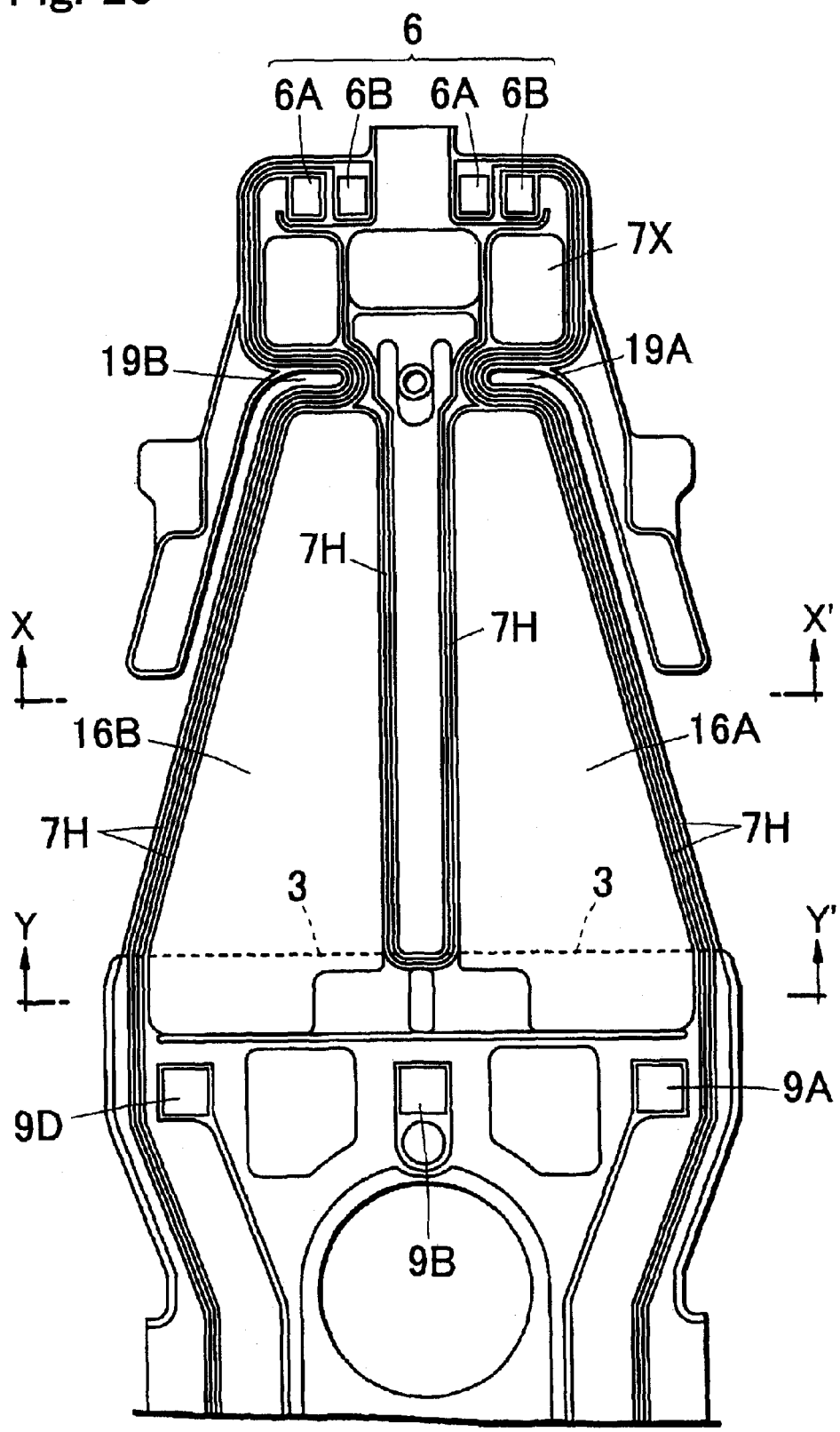
FIG. 25 is a top view of a flexure used for the head-supporting mechanism of the embodiment 2.
Figure 26:
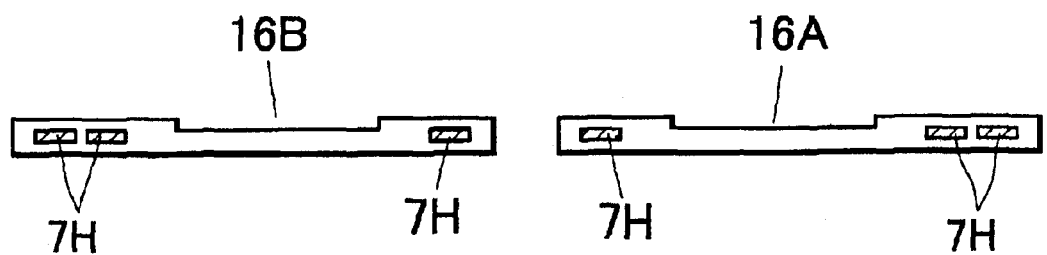
FIG. 26 is a sectional view of the flexure in FIG. 25 taken along the line X–X' of FIG. 25.

FIG. 24 is an exploded perspective view of the head-supporting mechanism of the embodiment 2, in which a magnetic head 1, slider 2, thin-film piezoelectric-member element 10, and load beam 4 are arranged the same as those of the head-supporting mechanism of the first embodiment. A flexure 70, however, is different from the flexure of the embodiment 1 in that the thin-film-piezoelectric-member-pasting portion 16A or 16B does not include the metallic plate 15A or 15B as shown in FIG. 26 (sectional view taken along the line X–X' in FIG. 25).

The thin-film piezoelectric-member-pasting portions 16A and 16B are a part of a flexible film-like substrate formed by an insulating material 16 such as a polyimide resin, and are formed into flat shapes almost the same as those of the thin-film piezoelectric-member elements 10A and 10B.

In the case of the flexure 70, the wiring pattern of a metallic wiring 7H connected to a magnetic head 1 is different from that of the embodiment 1, and only one thin-film piezoelectric-member terminal 9B is used, whereas two thin-film piezoelectric-member terminals 9B and 9C are used for the embodiment 1. However, the above-mentioned difference does not influence basic operations.

Figure 27:
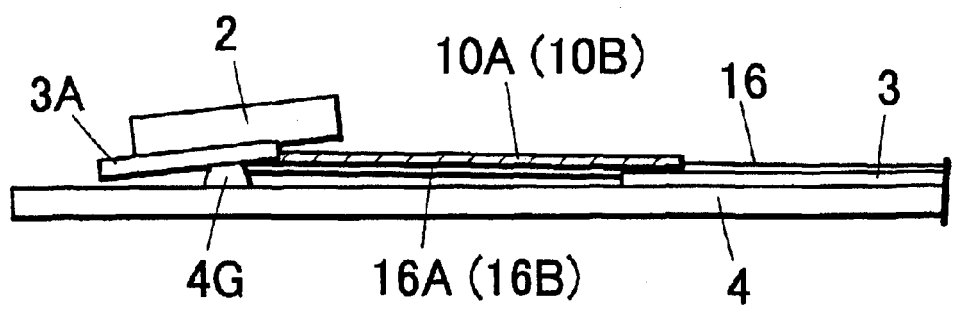
FIG. 27 is a side view of the head-supporting mechanism of the embodiment 2.

In the case of the head-supporting mechanism portion of the second embodiment, the flexure 70 and piezoelectric-member thin-film element 10 constituted as described above are combined with other components on the load beam 4, and a piezoelectric-member-driving portion is arranged on the load beam 4 as shown in FIG. 27.

Moreover, the head-supporting mechanism portion of the second embodiment is formed so that a wiring-portion-holding plate 3 faces a terminal-forming portion (portion on which the terminal piezoelectric-member pedestals 30A and 40A are formed), and the terminal-forming portion does not contribute to prevent the extension and contraction of the thin-film piezoelectric member 10.

The head-supporting mechanism portion of the second embodiment constituted as described above can be operated as described below.

Similarly to the case of the embodiment 1, the thin-film piezoelectric-member terminal 9B serving as a ground terminal is grounded, and voltages whose phases are opposite to each other about a bias voltage V0 are applied to thin-film-piezoelectric-member terminals 9A and 9D as shown in FIGS. 8B and 8C. Thus, extension/contraction degrees of the thin-film-piezoelectric-member elements 10A and 10B change corresponding to a voltage applied to the thin-film-piezoelectric-member terminals 9A and 9D. Therefore, for example, when the thin-film-piezoelectric-member element 10A greatly extends but the thin-film-piezoelectric-member element 10B slightly extends, the portion shown by symbol 19A loosens and the portion shown by symbol 19B is pulled. Thus, the slider-holding plate 3A can be rotated.

The head-supporting mechanism portion of the second embodiment constituted as described above to position a magnetic head by using a thin-film piezoelectric element can more accurately position the magnetic head compared to the case of a head-supporting mechanism portion for positioning a magnetic head by using a conventional voice coil motor and compared to the case of head-supporting mechanism using other piezoelectric elements.

Figure 28:
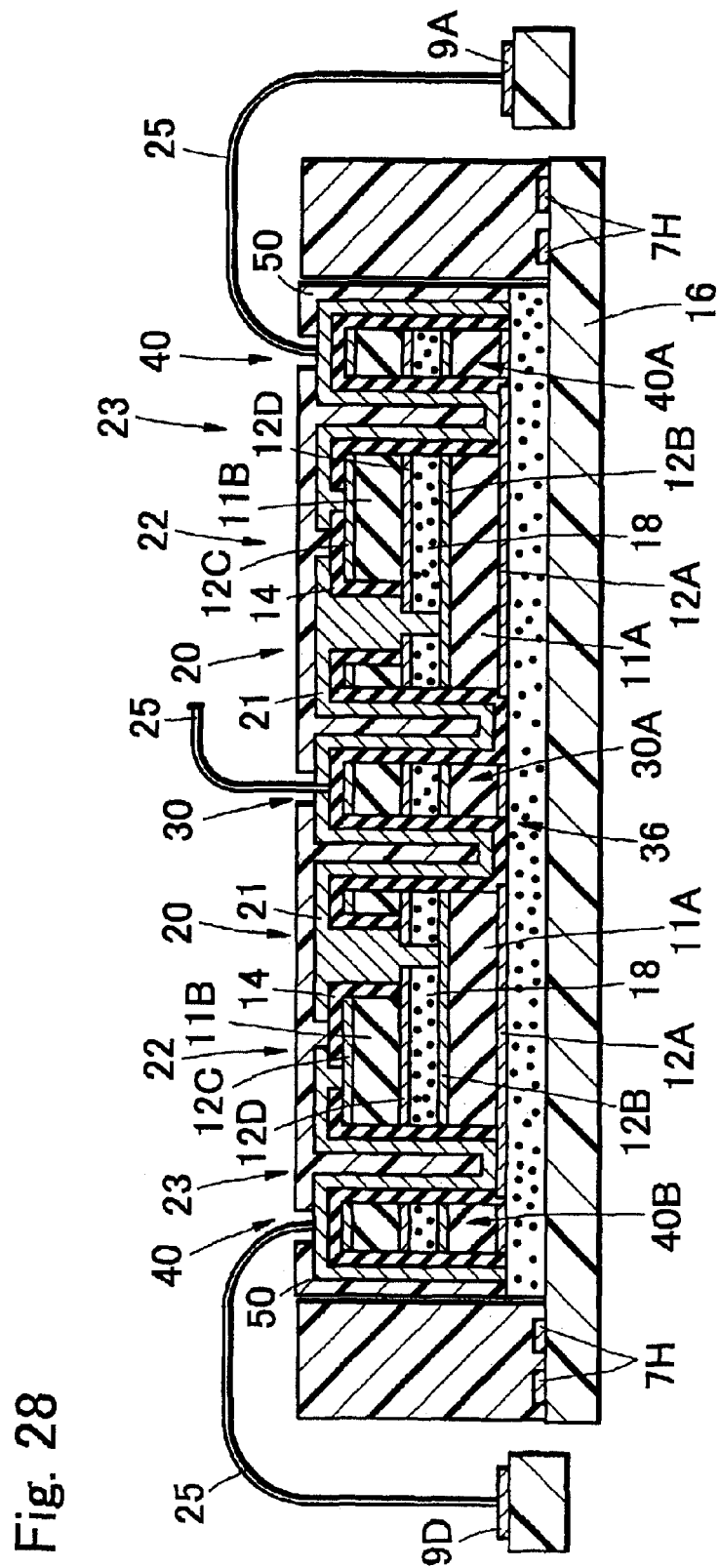
FIG. 28 is a sectional view showing an electrode configuration of a thin-film piezoelectric-member element used for the head-supporting mechanism of the embodiment 2.

FIG. 28 shows the terminal configuration and connection of the thin-film piezoelectric-member element 10 that is a characteristic portion of the head-supporting mechanism of the embodiment 2 with the thin-film piezoelectric-member terminals 9A, 9B and 9D.

Modification

Figure 29:
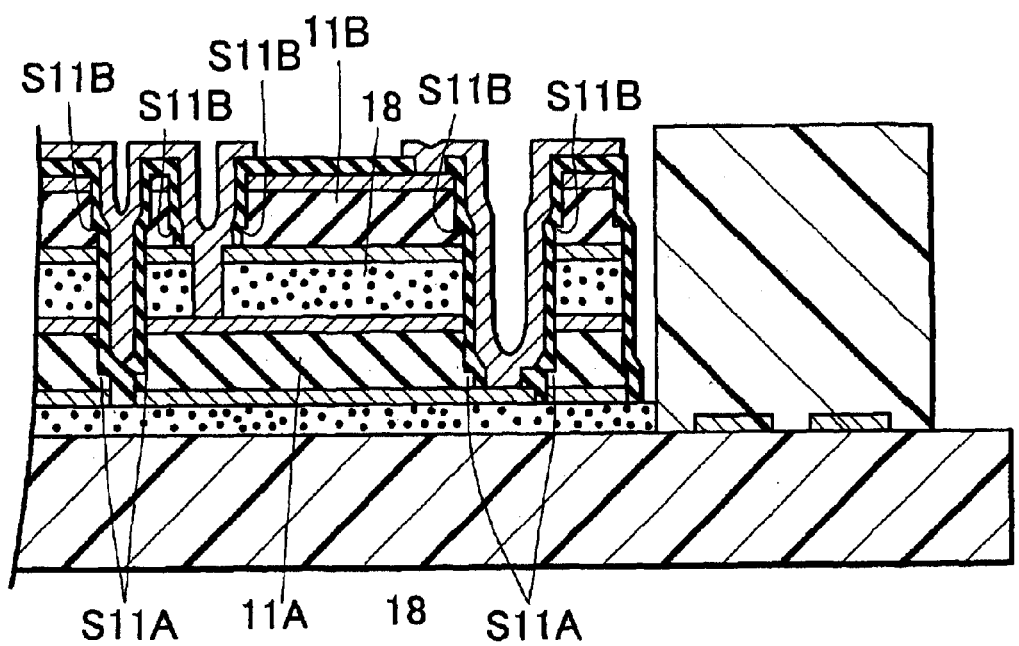
FIG. 29 is a sectional view showing an electrode configuration of a thin-film piezoelectric-member element in a modification of the present invention.

A head-supporting mechanism of a modification of the present invention is constituted the same as the head-supporting mechanism of the second embodiment except that the head-supporting mechanism of the second embodiment is constituted by the thin-film piezoelectric-member element shown by a sectional view in FIG. 29.

That is, in the case of the thin-film piezoelectric-member element of the modification, step portions S11A and S11B are formed on etching cross sections of a first thin-film piezoelectric-member layer 11A and a second thin-film piezoelectric-member layer 11B by etching the first thin-film piezoelectric-member layer 11A and second thin-film piezoelectric-member layer 11B in two stages, respectively.

In the case of the thin-film piezoelectric-member element thus constituted, conductive sidewall accretions accreting to a wall parallel with the etching direction in the dry etching step in a fabrication process are electrically separated by the step portions S11A and S11B. Therefore, the thin-film piezoelectric-member element of the modification makes it possible to decrease a leak current and to realize a higher-reliability head-supporting mechanism.

As described above in detail, in the case of a piezoelectric driving device of the present invention, it is possible to control the transfer of mechanical impacts or vibrations to the above piezoelectric displacement region under wire bonding and prevent cracks from occurring in the above piezoelectric thin plate because the above terminal electrode is formed on one side of the above substrate through a piezoelectric-member pedestal separated from the piezoelectric displacement region. Thus, it is possible to provide a piezoelectric driving device in which a short-circuit does not easily occur between electrode metallic films even if bonding-wire joining is performed.

Moreover, a piezoelectric-member-driving-device fabrication method of the present invention makes it possible to easily fabricate a high-reliability piezoelectric driving device.

What is claimed is:

1. A piezoelectric driving device comprising;
   a substrate having a first surface and a second surface;
   a piezoelectric plate on said first surface of said substrate, said piezoelectric plate having electrodes;
   piezoelectric pedestals on said first surface of said substrate, said piezoelectric pedestals being separated from said piezoelectric plate so as to prevent mechanical vibrations and mechanical impacts from being transmitted between said piezoelectric pedestals and said piezoelectric plate;
   wire bonding terminal electrodes for transmitting a signal for expanding and contracting said piezoelectric plate, said wire bonding terminal electrodes being located on said piezoelectric pedestals, respectively; and
   metal films for electrically connecting said wire bonding terminal electrodes to said electrodes of said piezoelectric plate, respectively.

2. The piezoelectric driving device of claim 1, wherein said piezoelectric plate and said piezoelectric pedestals have the same laminated structure including a plurality of layers.

3. The piezoelectric driving device of claim 1, wherein said substrate is operable to expand and contract corresponding to an expansion and contraction of said piezoelectric plate.

4. The piezoelectric driving device of claim 3, wherein said substrate comprises a polyimide substrate.

5. The piezoelectric driving device of claim 1, wherein said substrate comprises a non-retractable substrate operable to deflect.

6. The piezoelectric driving device of claim 5, wherein said non-retractable substrate comprises a metal plate fixed opposite said piezoelectric plate by a resin.

7. The piezoelectric driving device of claim 1, wherein said piezoelectric plate is divided into a first piezoelectric plate portion and a second piezoelectric plate portion separated from each other so as to form two piezoelectric driving portions.

8. The piezoelectric driving device of claim 7, wherein said wire bonding terminal electrodes consist of a first signal terminal electrode connected to a first one of said two piezoelectric driving portions, a second signal terminal electrode connected to a second one of said two piezoelectric driving portions, and a ground terminal electrode common to said two piezoelectric driving portions.

9. The piezoelectric driving device of claim 1, wherein said piezoelectric plate has a laminated structure including:
   a first piezoelectric film layer having an electrode film formed on both faces thereof; and
   a second piezoelectric film layer having an electrode film formed on both faces thereof;
   wherein said first piezoelectric film layer and said second piezoelectric film layer are joined by an adhesive so that said electrode films face each other through said adhesive.

10. The piezoelectric driving device of claim 1, further comprising signal terminal electrodes on said substrate, said signal terminal electrodes being electrically connected to said wire bonding terminal electrodes on said piezoelectric pedestals, respectively, by wires.

11. The piezoelectric driving device of claim 1, wherein said piezoelectric plate is free of any wire bonding terminal electrodes.

12. A method of manufacturing a piezoelectric driving device, comprising:

layering a first electrode, a first piezoelectric film, and a second electrode on a first substrate;

layering a third electrode, a second piezoelectric film, and a fourth electrode on a second substrate;

arranging the second electrode so as to face the fourth electrode;

bonding the second electrode to the fourth electrode by an adhesive to thereby paste the first substrate to the second substrate so as to form a piezoelectric laminated-body layer in which the first electrode, the first piezoelectric film, the second electrode, the fourth electrode, the second piezoelectric film, and the third electrode are laminated between the first substrate and the second substrate;

removing the second substrate;

dividing the piezoelectric laminated-body layer on the first substrate so as to form at least two piezoelectric pedestals and a piezoelectric plate, wherein the piezoelectric pedestals are separated from the piezoelectric plate such that mechanical vibrations and mechanical impacts are prevented from being transmitted between the piezoelectric pedestals and the piezoelectric plate;

forming a first bonding electrode connected to the second electrode and the fourth electrode on a first one of the piezoelectric pedestals, and forming a second bonding electrode connected to the first electrode and the third electrode on a second one of the piezoelectric pedestals;

joining a transferring substrate onto the piezoelectric pedestals and the piezoelectric plate, and then removing the first substrate and the transferring substrate; and joining a non-retractable deflectable substrate onto a side of the piezoelectric pedestals and the piezoelectric plate where the removed first substrate was located.

13. The method of claim 12, further comprising forming no wire bonding electrodes on the piezoelectric plate.

\* \* \* \* \*